(12) United States Patent
Yamawaki et al.

(10) Patent No.: US 9,082,783 B2
(45) Date of Patent: Jul. 14, 2015

(54) SEMICONDUCTOR DEVICE AND FABRICATION METHOD THEREOF

(71) Applicant: Micron Technology, Inc., Boise, ID (US)

(72) Inventors: Hiroki Yamawaki, Tokyo (JP); Noriyuki Asami, Tokyo (JP); Shigehisa Inoue, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/468,447

(22) Filed: Aug. 26, 2014

(65) Prior Publication Data
US 2015/0079756 A1 Mar. 19, 2015

(30) Foreign Application Priority Data

Sep. 18, 2013 (JP) .................................. 2013-192741
Apr. 18, 2014 (JP) .................................. 2014-086449

(51) Int. Cl.
| | |
|---|---|
| *H01L 21/20* | (2006.01) |
| *H01L 49/02* | (2006.01) |
| *H01L 21/283* | (2006.01) |
| *H01L 21/02* | (2006.01) |
| *H01L 29/16* | (2006.01) |
| *H01L 27/108* | (2006.01) |

(52) U.S. Cl.
CPC ............ *H01L 28/60* (2013.01); *H01L 21/0262* (2013.01); *H01L 21/02381* (2013.01); *H01L 21/283* (2013.01); *H01L 27/10805* (2013.01); *H01L 29/1604* (2013.01)

(58) Field of Classification Search
USPC .......................................................... 438/386
See application file for complete search history.

(56) References Cited

U.S. PATENT DOCUMENTS

| | | | |
|---|---|---|---|
| 2003/0008469 A1 | 1/2003 | Hwang et al. | |
| 2004/0051153 A1* | 3/2004 | Yamamoto et al. | 257/412 |
| 2004/0159909 A1* | 8/2004 | Kim et al. | 257/532 |
| 2006/0197135 A1 | 9/2006 | Inoue | |
| 2007/0281470 A1* | 12/2007 | Takasaki | 438/637 |
| 2010/0035402 A1* | 2/2010 | Hirota | 438/393 |
| 2012/0098092 A1* | 4/2012 | Park et al. | 257/532 |
| 2012/0184078 A1* | 7/2012 | Kiyotoshi | 438/268 |

FOREIGN PATENT DOCUMENTS

JP  2006-245364  9/2006

* cited by examiner

*Primary Examiner* — Asok K Sarkar
(74) *Attorney, Agent, or Firm* — Wells St. John, P.S.

(57) ABSTRACT

The semiconductor device fabrication method of the present invention includes: laminating a plurality of amorphous silicon films on a semiconductor substrate, forming through-holes that pass through the plurality of amorphous silicon films, and subjecting the plurality of amorphous silicon films 301 that include the through-holes to an etching process that uses an alkaline aqueous solution; wherein the plurality of amorphous silicon films is formed to include a first amorphous silicon film and a second amorphous silicon film in which the rate of etching by using the alkaline aqueous solution is slower than that of the first amorphous silicon film and the first amorphous silicon film is interposed between the semiconductor substrate and the second amorphous silicon film.

10 Claims, 14 Drawing Sheets

SEMICONDUCTOR DEVICE AND FABRICATION METHOD THEREOF

TECHNICAL FIELD

The present invention relates to a semiconductor device and to a fabrication method of the semiconductor device.

BACKGROUND ART

The miniaturization of semiconductor devices such as DRAM (Dynamic Random Access Memory) has been accompanied by the creation of a need for capacitors that occupy a smaller area, these capacitors being the capacitive elements that make up a semiconductor device. A capacitor that makes up a semiconductor device is typically formed by providing a cylindrical hole in a silicon oxide film and then providing capacitor electrodes on the inner surfaces of the cylindrical hole. The capacitance of the capacitor that is formed is a value that depends on the surface area of the capacitor electrodes, i.e., the area of the inner surfaces of the cylindrical hole.

Reducing the size of the footprint of a capacitor entails decreasing the diameter of the cylindrical hole. If the diameter of the cylindrical hole is decreased without changing its depth, the area of the inner surfaces of the cylindrical hole decrease and the capacitance of the capacitor decreases. However, in order to allow the semiconductor device to operate correctly, a capacitor capacitance of at least a fixed value must be maintained.

In order to compensate for the amount of decrease in the capacitance of the capacitor that results from reducing the area occupied by the capacitor, a technique is typically employed in which the depth of the cylindrical hole that is used to form the capacitor is increased. According to this technique, a decrease in the capacitance of the capacitor that results from a decrease of the diameter of the cylindrical hole can be compensated for by increasing the depth of the cylindrical hole and thus increasing the area of the inner surfaces of the cylindrical hole.

In the technique described above, the smaller the area that can be occupied by the capacitor, the more the diameter must be decreased and the greater the depth must be increased in the cylindrical hole that is formed. The cylindrical hole is normally formed by erosion brought about by etching a silicon oxide film. When etching a small diameter, the diameter tends to decrease in the direction of the advance of etching. Accordingly, the depth that can be etched is determined by the size of the diameter, and forming a cylindrical hole having a smaller diameter and greater depth therefore becomes problematic, and forming a cylindrical hole of a desired depth becomes impossible.

Patent Document 1 (Japanese Unexamined Patent Application Publication No. 2006-245364) and Patent Document 2 (US 20030008469 A1) disclose a technique of forming a cylindrical hole in a silicon film in which the rate of advance of etching is faster than for a silicon oxide film. According to the technique disclosed in Patent Document 1, the rate of advance of dry etching of the silicon film is faster and the hole-opening process is easier than for a silicon oxide film, whereby, despite the smaller diameter, a cylindrical hole of greater depth can be formed.

LITERATURE OF THE PRIOR ART

Patent Documents

Patent Document 1: Japanese Unexamined Patent Application Publication No. 2006-245364
Patent Document 2: US 20030008469 A1

SUMMARY

Problem to be Solved by the Invention

The advance in the miniaturization of semiconductor devices has created a need for capacitors that occupy an even smaller area.

In order to increase the area of the inner surfaces when the area occupied by the cylindrical hole is small, the cylindrical hole is preferably formed in a cylindrical shape. However, the diameter of a cylindrical hole that is formed by etching normally decreases in the direction of the advance of etching, whereby an inverted truncated cone shape is formed. When the cylindrical hole is formed in the shape of an inverted truncated cone, the surface area is smaller than in the case of a cylinder. As a result, a capacitor realized by a cylindrical hole that has been formed in the shape of an inverted truncated cone cannot ensure a capacitor that has sufficient capacitance.

The technique disclosed by Patent Document 1 does not take into consideration the problem of insufficient area of the inner surfaces of a cylindrical hole due to the formation of the cylindrical hole in the shape of an inverted truncated cone.

Means for Solving the Problem

The fabrication method of the semiconductor device of the present invention includes:
laminating a plurality of amorphous silicon films on a semiconductor substrate;
forming a through-hole that passes through the plurality of amorphous silicon films; and
subjecting the plurality of amorphous silicon films having the through-hole to an etching process by an alkaline aqueous solution;
wherein: the plurality of amorphous silicon films is formed including a first amorphous silicon film and a second amorphous silicon film for which the rate of etching using an alkaline aqueous solution is slower than that of the first amorphous silicon film; and said first amorphous silicon film being interposed between the semiconductor substrate and the second amorphous silicon film.

Effect of the Invention

According to the present invention, a plurality of amorphous silicon films is laminated on a semiconductor substrate, a through-hole is formed that passes though the plurality of amorphous silicon films that were laminated, following which the plurality of amorphous silicon films having the through-hole are subjected to etching by an alkaline aqueous solution. In addition, the plurality of amorphous silicon films include a first amorphous silicon film and a second amorphous silicon film for which the rate of etching is slower than that of the first amorphous silicon film, and further, the first amorphous silicon film is stacked so as to be interposed between the semiconductor substrate and the second amorphous silicon film.

Because the etching rate of the first amorphous silicon film is faster than that of the second amorphous silicon film, the amount of enlargement of the diameter of the through-hole due to the etching process of the first amorphous silicon film is greater than that of the second amorphous silicon film. Accordingly, stepped portions occur in the inner walls of the through-hole due to the implementation of the etching process, whereby the area of the inner walls of the through-hole increases.

In addition, the first amorphous silicon film is interposed between the semiconductor substrate and the second amorphous silicon film. Because a through-hole that passes through an amorphous silicon film typically has an inverted truncated conical shape, the diameter of the through-hole will be smaller for the first amorphous silicon film that is located on the lower side than for the second amorphous silicon film located on the upper side. As described hereinabove, the amount of enlargement of the diameter of a through-hole resulting from an etching process will be greater in the first amorphous silicon film than in the second amorphous silicon film.

Accordingly, the amount of enlargement is greater at the opening in the first amorphous silicon film in which the diameter is smaller, and the amount of enlargement is smaller at the opening in the second amorphous silicon film in which the diameter is larger, whereby an increase of the area occupied by the through-hole after etching is prevented.

The area of the inner walls of a through-hole can thus be increased while preventing an increase of the area occupied by the through-hole, and as a result, forming a capacitor in the through-hole can prevent a decrease of capacitance that accompanies a decrease of the area occupied by the capacitor.

According to the present invention, a semiconductor device is provided with: a plurality of polycrystalline silicon films that are laminated on a semiconductor substrate, and a capacitor that is made up of a sidewall insulating film, a lower electrode film, a capacitive insulating film, and an upper electrode film that are formed on the inner walls of a through-hole that passes through the laminated polycrystalline silicon films. In addition, stepped portions occur between adjacent polycrystalline silicon films in the through-hole.

The occurrence of stepped portions between adjacent polycrystalline silicon films enables an increase in the area of the inner walls of the through-hole. In other words, the area of the inner walls of the through-hole can be increased without increasing the diameter of the through-hole. As a result, the decrease of capacitance that accompanies a decrease of the area occupied by a capacitor can be limited.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Modes for carrying out the present invention are next described with reference to the accompanying drawings.

First Exemplary Embodiment

The schematic configuration of semiconductor device 100 of the first exemplary embodiment of the present invention is first described.

Figure 1A:
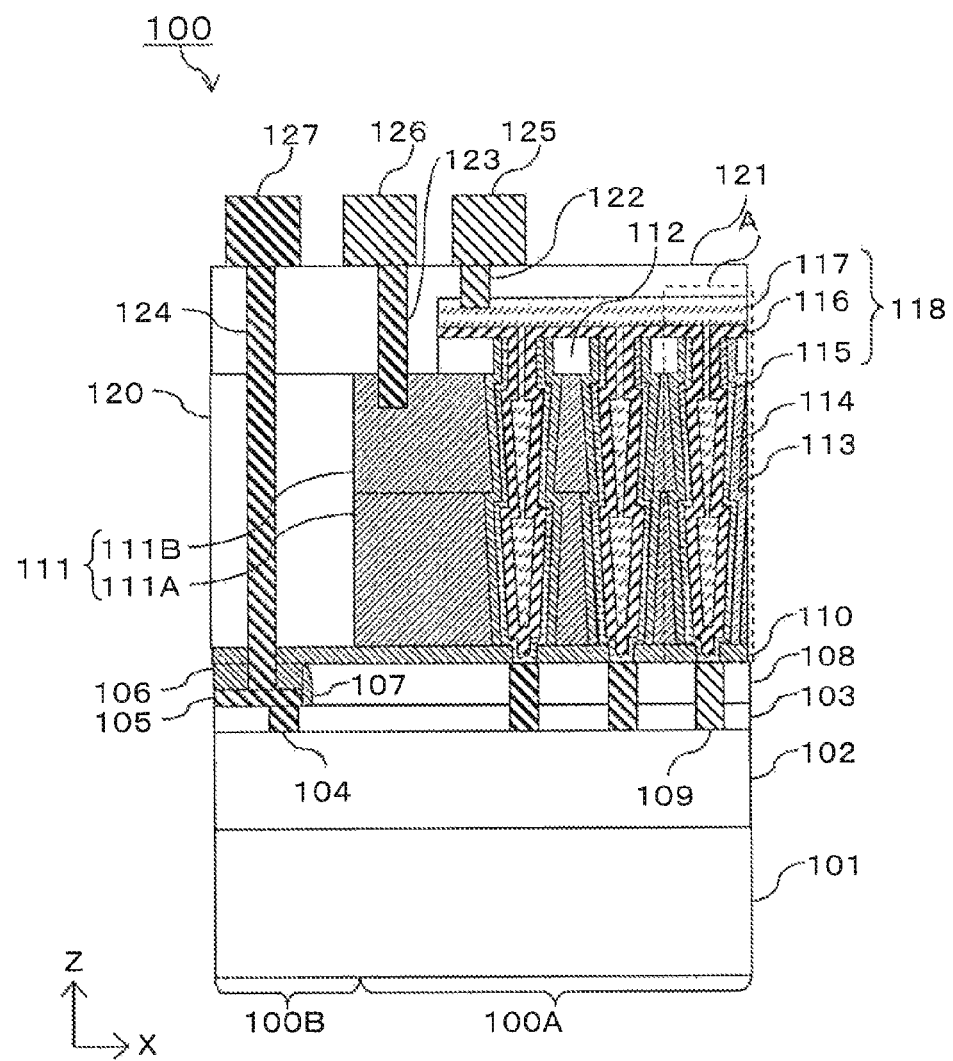
FIG. 1A is a sectional view of the semiconductor device of the first exemplary embodiment of the present invention.

FIG. 1A is a sectional view of semiconductor device 100.

In the following explanation, the direction that is orthogonal to the substrate surface of semiconductor device 100 is the Z-direction, and the two directions orthogonal to the Z-direction are the X-direction and the Y-direction. The X-direction is the left-right direction in FIG. 1A, and the Y-direction is the direction orthogonal to section shown in FIG. 1A.

As shown in FIG. 1A, semiconductor device 100 includes silicon substrate 101 that is made up of memory cell region 100A that is provided with memory cells, and peripheral circuit region 100B in which are provided peripheral circuits for carrying out reading and writing of information to the memory cells.

MOS (Metal Oxide Semiconductor) transistors and wiring (not shown in the figure) are formed on the upper surface of silicon substrate 101.

First interlayer dielectric film 102 is formed to cover the MOS transistors and wiring formed on the upper surface of semiconductor substrate 101.

Second interlayer dielectric film 103 is formed on the upper surface of first interlayer dielectric film 102.

Contact plug 104 that passes through second interlayer dielectric film 103 and that connects with MOS transistors and wiring formed on silicon substrate 101 is formed in peripheral circuit region 100B.

Wiring 105 that connects with contact plug 104 is formed on the upper surface of second interlayer dielectric film 103. Wiring insulating film 106 is formed on wiring 105 to cover the wiring.

Sidewall insulating film 107 is formed so as to cover the sidewalls of wiring 105 and wiring insulating film 106.

Third interlayer dielectric film 108 is formed in the region of the upper surface of second interlayer dielectric film 103 in which wiring 105, wiring insulating film 106, and sidewall insulating film 107 are not formed.

Contact plug 109 that passes through second interlayer dielectric film 103 and third interlayer dielectric film 108 and that connects with MOS transistors and wiring that are formed on the upper surface of silicon substrate 101 is formed in memory cell region 100A.

Stopper insulating film 110 is formed on the upper surfaces of wiring insulating film 106, sidewall insulating film 107, and third interlayer dielectric film 108. Stopper insulating film 110 functions as a mask at the time of an etching process.

Cylinder interlayer film 111 is formed on the upper surface of stopper insulating film 110 in memory cell region 100A.

Cylinder interlayer film 111 is made up of first polycrystalline silicon film 111A and second polycrystalline silicon film 111B. First polycrystalline silicon film 111A is formed on the upper surface of stopper insulating film 110, and second polycrystalline silicon film 111B is formed on the upper surface of first polycrystalline silicon film 111A.

First polycrystalline silicon film 111A is a conductor realized by subjecting an amorphous silicon film that has been formed by a plasma CVD method to heat treatment to convert the amorphous silicon film to a polycrystalline form, and second polycrystalline silicon film 111B is a conductor realized by subjecting an amorphous silicon film that is grown by means of a thermal CVD method to a heat treatment to convert the amorphous silicon film to a polycrystalline form. First polycrystalline silicon film 111A and second polycrystalline silicon film 111B both contain impurities at a concentration of $1\times10^{20}$-$1\times10^{21}$ (atoms/cm$^3$). An n-type impurity such as phosphorus or arsenic or a p-type impurity such as boron is used as the impurity.

Mask insulating film 112 is formed on a portion of the upper surface of second polycrystalline silicon film 111B.

Cylindrical holes 113 are formed that pass through mask insulating film 112, second polycrystalline silicon film 111B, first polycrystalline silicon film 111A, and stopper insulating film 110. Sidewall insulating film 114, lower electrode 115, capacitive insulating film 116, and upper electrode 117 are formed in each cylindrical hole 113. As will be described hereinbelow, capacitor 118 is made up of electrode 115, capacitive insulating film 116, and upper electrode 117.

Figure 1B:
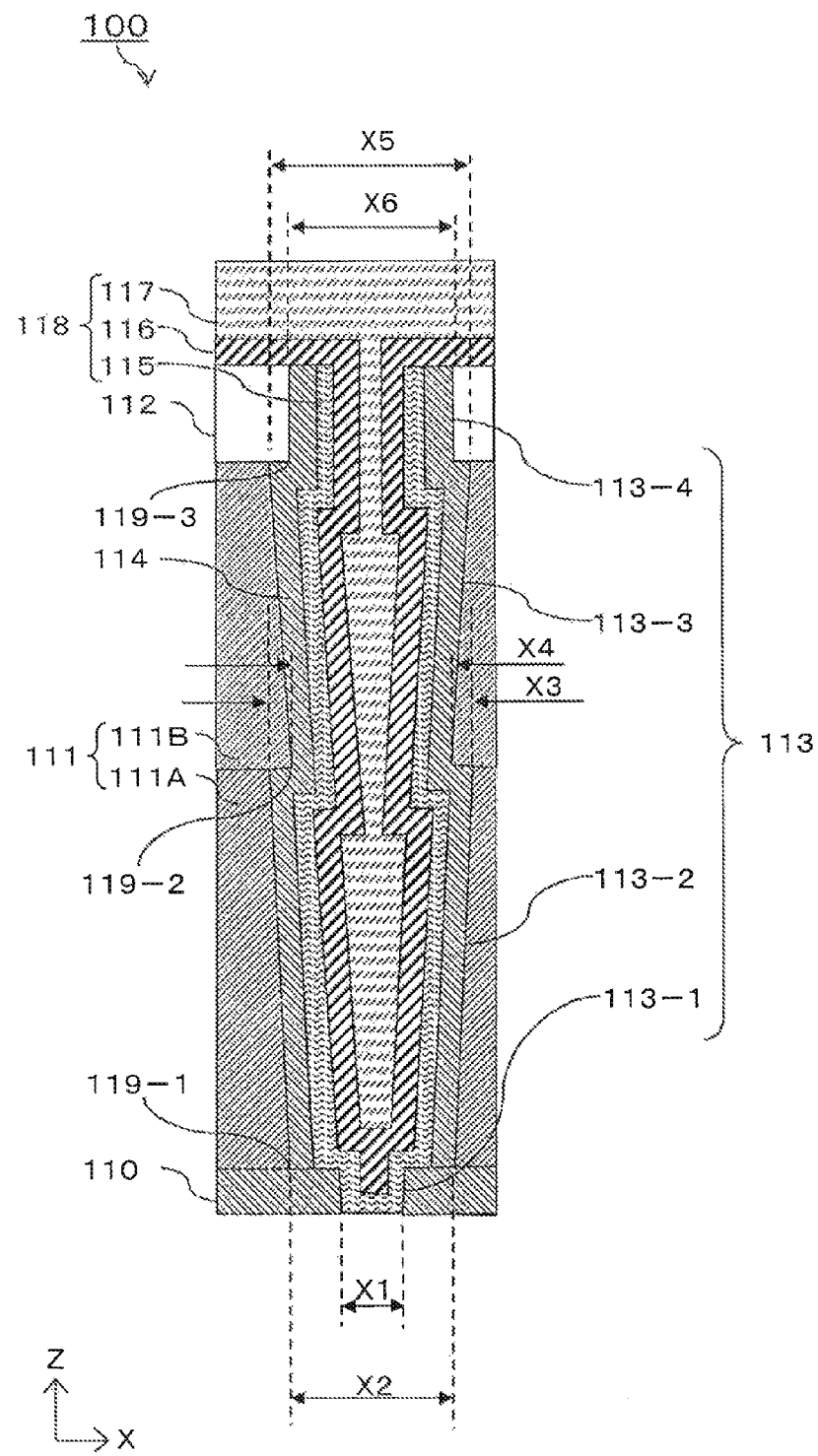
FIG. 1B is an enlarged view of region A shown in FIG. 1A.

FIG. 1B is a sectional view showing the configuration of region A in the vicinity of cylindrical hole 113.

As shown in FIG. 1B, cylindrical hole 113 is formed to pass through stopper insulating film 110, cylinder interlayer film 111, and mask insulating film 112.

In the following explanation, the opening of stopper insulating film 110 is referred to as stopper insulating film opening 113-1, the opening of first polycrystalline silicon film 111A is referred to as first silicon film opening 113-2, the opening of second polycrystalline silicon film 111B is referred to as second silicon film opening 113-3, and the opening of mask insulating film 112 is referred to as mask insulating film opening 113-4.

Stopper insulating film opening 113-1 is formed to have a diameter of X1 with the upper opening diameter and the lower opening diameter being substantially equal.

First silicon film opening 113-2 is formed such that the lower opening diameter is diameter X2 that is larger than diameter X1 and the upper opening diameter is diameter X3 that is larger than diameter X2.

Second silicon film opening 113-3 is formed such that the lower opening diameter is diameter X4 that is smaller than diameter X3 and the upper opening diameter is diameter X5 that is greater than diameter X4.

Mask insulating film opening 113-4 is formed such that the upper opening diameter and the lower opening diameter are substantially the same and their diameter is X6 that is smaller than diameter X5.

The upper opening diameter (X1) of stopper insulating film opening 113-1 is smaller than the lower opening diameter (X2) of first silicon film opening 113-2. As a result, the side surfaces of stopper insulating film opening 113-1 and the side surfaces of first silicon film opening 113-2 are not continuous and form stepped portion 119-1.

The upper opening diameter (X3) of first silicon film opening 113-2 is greater than the lower opening diameter (X4) of second silicon film opening 113-3. As a result, the side surfaces of first silicon film opening 113-2 and the side surfaces of second silicon film opening 113-3 are not continuous and form stepped portion 119-2.

The upper opening diameter (X5) of second silicon film opening 113-3 is greater than the lower opening diameter (X6) of mask insulating film opening 113-4. As a result, the side surfaces of second silicon film opening 113-3 and the side surfaces of mask insulating film opening 113-4 are not continuous and form a stepped portion.

In this way, in the through-hole of cylindrical hole 113, stepped portion 119-1 is produced on the inner surfaces (inner walls) between stopper insulating film 110 and first polycrystalline silicon film 111A, stepped portion 119-2 is produced on the inner surfaces between first polycrystalline silicon film 111A and second polycrystalline silicon film 111B, and stepped portion 119-3 is produced on the inner surfaces between second polycrystalline silicon film 111B and mask insulating film 112. Accordingly, a saw-tooth shape is formed by the inner surfaces of cylindrical hole 113.

Sidewall insulating film 114 is formed at a fixed thickness so as to cover the inner surfaces of first silicon film opening 113-2, second silicon film opening 113-3, and mask insulating film opening 113-4. Sidewall insulating film 114 is formed in the saw-tooth shape similar to the inner surfaces of cylindrical hole 113.

Lower electrode 115 is formed so as to cover the inner surfaces of stopper insulating film opening 113-1 and sidewall insulating film 114 and to connect with contact plug 109. Lower electrode 115 is also formed with a saw-tooth shape similar to the inner surfaces of cylindrical hole 113.

Capacitive insulating film 116 is formed so as cover the inner surface and upper surface of lower electrode 115 and the upper surfaces of mask insulating film 112 and sidewall insulating film 114.

Upper electrode 117 is formed so as to cover the inner surfaces and upper surface of capacitive insulating film 116 and fill the interior of capacitive insulating film 116.

Again referring to FIG. 1A, in peripheral circuit region 100B, peripheral insulating film 120 of the same height as cylinder interlayer film 111 is formed on the upper surface of stopper insulating film 110.

Fourth interlayer dielectric film 121 is formed so as to cover peripheral insulating film 120, second polycrystalline silicon film 111B and upper electrode 117.

In memory cell region 100A, contact plug 122 is formed that passes through fourth interlayer dielectric film 121 and that connects with upper electrode 117. In addition, contact plug 123 is formed that passes through fourth interlayer dielectric film 121 and that connects with second polycrystalline silicon film 111B.

In peripheral circuit region 100B, contact plug 124 is formed that passes through fourth interlayer dielectric film 121, peripheral insulating film 120, stopper insulating film 110 and wiring insulating film 106 and that connects with wiring 105.

On the upper surface of fourth interlayer dielectric film 121, upper electrode power-supply wiring 125 is formed to connect with upper electrode 117 by way of contact plug 122, cylinder interlayer film power-supply wiring 126 is formed to connect with second polycrystalline silicon film 111B by way of contact plug 123, and wiring 127 is formed to connect with wiring 105 by way of contact plug 124.

The construction of the capacitor in semiconductor device 100 is next described.

The capacitor in semiconductor device 100 is of a crown structure in which a capacitor is formed on both the inside and outside of lower electrode 115.

In other words, capacitor 118 is made up of lower electrode 115, capacitive insulating film 116, and upper electrode 117, capacitor 118 operating as an inner capacitor. The other capacitor is made up of lower electrode 115, sidewall insulating film 114 that serves as the capacitive insulating film, and cylinder interlayer film 111 that serves as the upper electrode, and this capacitor operates as an outer capacitor.

When upper electrode power-supply wiring 125 that connects with upper electrode 117 and cylinder interlayer film power-supply wiring 126 that connects with cylinder interlayer film 111 are connected to respectively differing wiring, the inner capacitor and the outer capacitor can be independently controlled by different applied voltages. Alternatively, when upper electrode power-supply wiring 125 and cylinder interlayer film power-supply wiring 126 are connected to the same wiring, the inner capacitor and the outer capacitor can be simultaneously controlled by the same applied voltage.

The fabrication steps of semiconductor device 100 are next described with reference to FIGS. 2A-6B. Each of FIGS. 2A, 3A, 4A, 5A, and 6A is a top view of semiconductor device 100, and each of FIGS. 2B, 3B, 4B, 5B, and 6B is a sectional view taken along line B-B' shown in FIGS. 2A, 3A, 4A, 5A, and 6A, respectively.

Figure 2A:
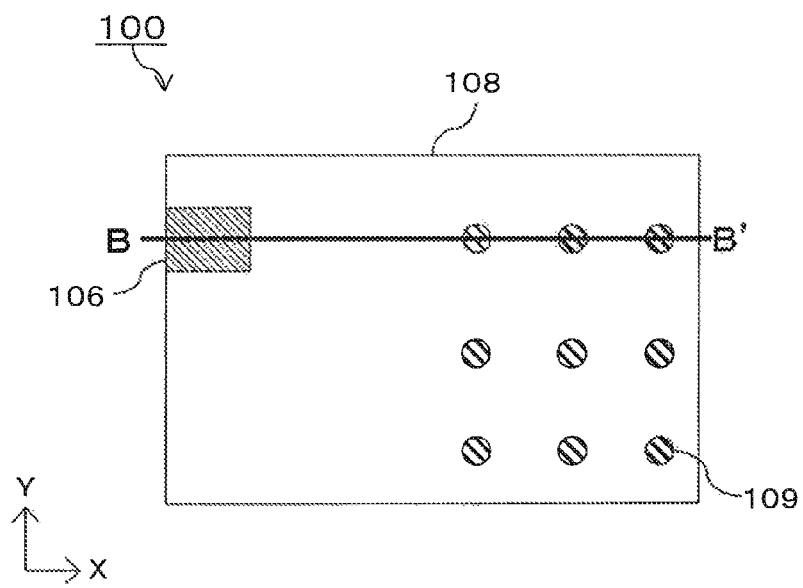
FIG. 2A is a top view in a fabrication step of the semiconductor device shown in FIG. 1A.
Figure 2B:
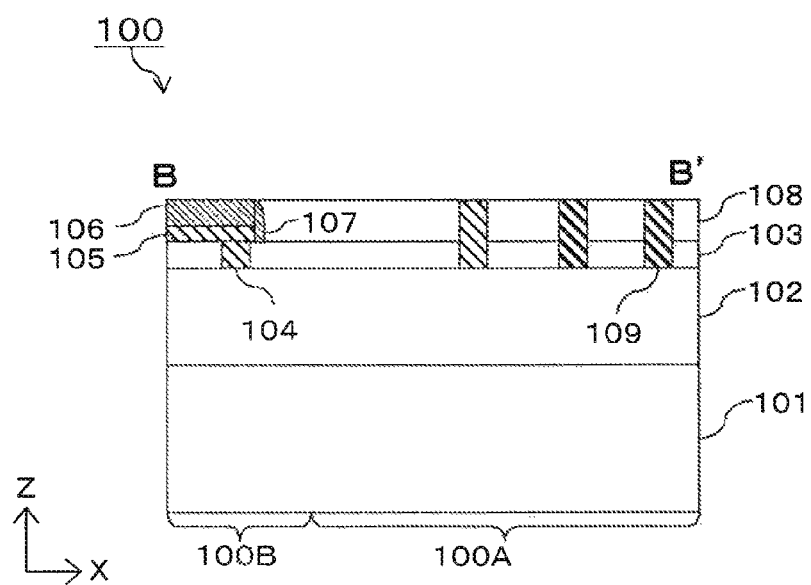
FIG. 2B is a sectional view taken along line B-B' shown in FIG. 2A.

Referring to FIGS. 2A and 2B, MOS transistors and wiring (not shown) are formed on the upper surface of silicon substrate 101. Further, first interlayer dielectric film 102 that is composed of a silicon oxide film is grown so as to cover the MOS transistors and wiring. The formation of the MOS transistors and wiring and the formation of the silicon oxide film are carried out by the same methods as the fabrication methods that are used to produce typical semiconductor devices.

Second interlayer dielectric film 103 composed of a silicon oxide film is next formed on the upper surface of first interlayer dielectric film 102 by a plasma CVD (Chemical Vapor Deposition) method.

A first opening (not shown) is next formed in peripheral circuit region 100B by means of a photolithographic method and a dry-etching method so as to penetrate second interlayer dielectric film 103 and expose an MOS transistor that is formed on the upper surface of silicon substrate 101. Still further, a conductive film composed of tungsten (W) is formed so as to fill the first opening.

When forming the conductive film so as to fill the first opening, the conductive film is also grown on the upper surface of second interlayer dielectric film 103. The conductive film that is grown on the upper surface of second interlayer dielectric film 103 is removed by means of a CMP (Chemical Mechanical Polishing) method, whereby contact plug 104 that connects with a MOS transistor is formed in the first opening.

A conductive film composed of tungsten is next grown by a sputtering method on the upper surface of second interlayer dielectric film 103, and a silicon nitride film is then grown by a plasma CVD method on this conductive film. Finally, the conductive film and silicon nitride film that were formed are patterned by a photolithographic method and a dry-etching method to form a predetermined wiring pattern. In this way, wiring 105 composed of the tungsten that connects with contact plug 104 and wiring insulating film 106 composed of the silicon nitride film that is provided on the upper surface of wiring 105 are formed in peripheral circuit region 100B.

Sidewall insulating film 107 composed of a silicon nitride film is next grown by means of a thermal CVD method and a dry-etching method to cover the side surfaces of wiring 105 and wiring insulating film 106.

SOD (Spin On Dielectric) composed of an applied insulating material is next applied to embed wiring 105, wiring insulating film 106, and sidewall insulating film 107, and the SOD is subjected to a heat treatment to form a silicon oxide film.

When subjecting the applied SOD to a heat treatment to form the silicon oxide film, silicon oxide is also formed on the upper surface of wiring insulating film 106, and the silicon oxide film is therefore leveled by a CMP method until wiring insulating film 106 is exposed. In this way, third interlayer dielectric film 108 that is composed of the silicon oxide film is formed.

Second openings (not shown) are next formed in memory cell region 100A by means of a photolithography method and a dry-etching method so as to penetrate third interlayer dielectric film 108 and second interlayer dielectric film 103 and expose MOS transistors that were formed on the upper surface of silicon substrate 101.

A conductive film composed of polysilicon or tungsten is next grown so as to fill the second openings. When the conductive film is polysilicon, the conductive film is formed by a thermal CVD method, and when the conductive film is tungsten, the conductive film is formed by a CVD method.

When forming the conductive film so as to fill the second openings, the conductive film is also formed on the upper surface of third interlayer dielectric film 108. The conductive film that has formed on the upper surface of third interlayer dielectric film 108 is removed by a CMP method, whereby contact plugs 109 that are connected with the MOS transistors are formed in the second opening.

Figure 3A:
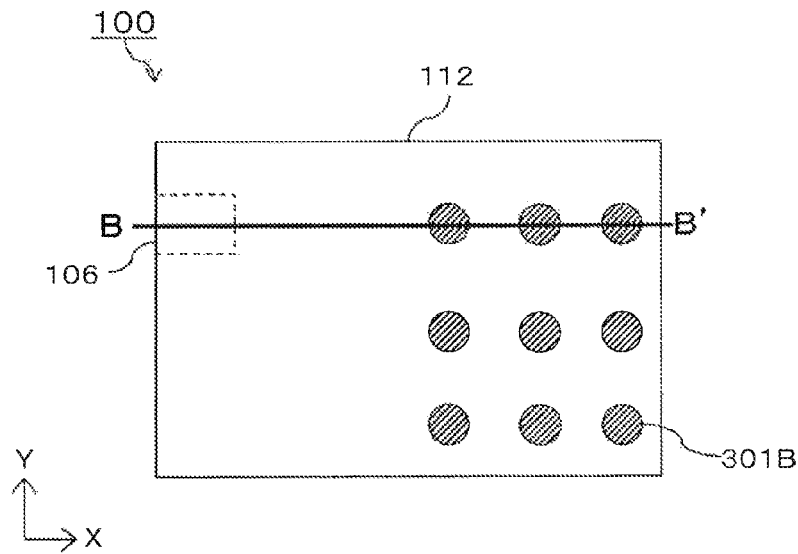
FIG. 3A is a top view in a fabrication step of the semiconductor device shown in FIG. 1A.
Figure 3B:
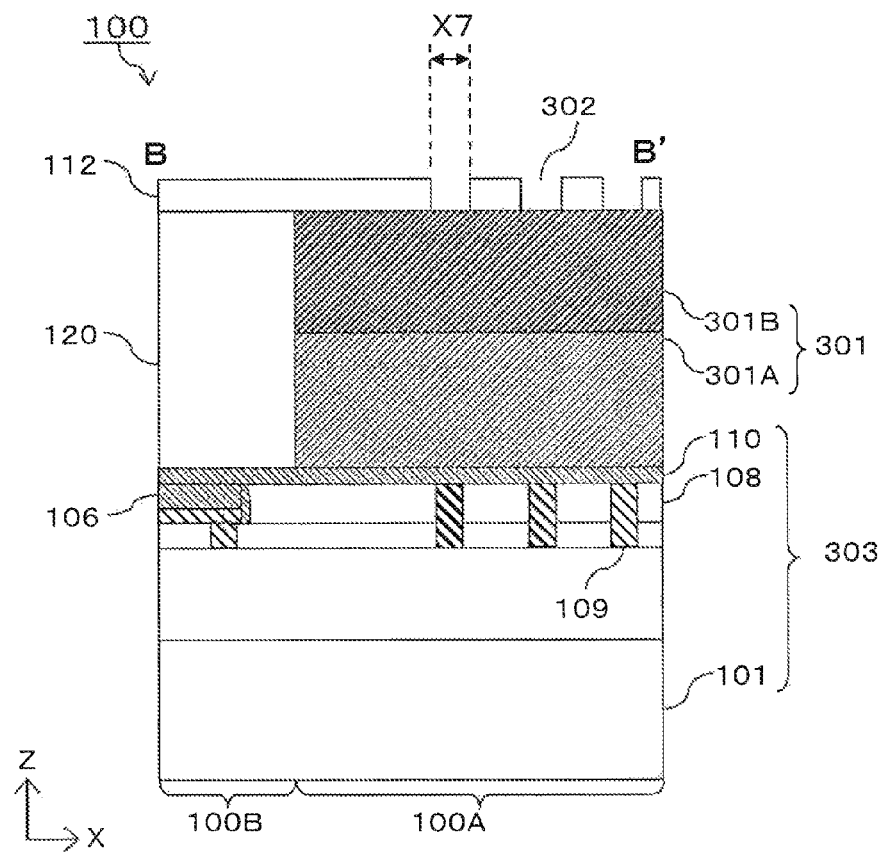
FIG. 3B is a sectional view taken along line B-B' shown in FIG. 3A.

Next, referring to FIGS. 3A and 3B, stopper insulating film 110 composed of silicon nitride film having a thickness of 50 nm is grown by a thermal CVD method on the upper surfaces of wiring insulating film 106 and third interlayer dielectric film 108. In the following explanation, the construction described hereinabove, in which a stopper insulating film is formed that covers the MOS transistors that were formed on the silicon substrate, the contact plugs that connect with the MOS transistors and the interlayer dielectric film that embeds the MOS transistors and contact plugs, is referred to as semiconductor substrate 303.

A lamination step is next carried out to stack first amorphous silicon film 301A that will become first polycrystalline silicon film 111A and second amorphous silicon film 301B that will become second polycrystalline silicon film 111B on the upper surface of semiconductor substrate 303.

More specifically, first amorphous silicon film 301A having a thickness of 1 μm is first grown on the upper surface of stopper insulating film 110 by means of a plasma CVD method. In this plasma CVD method, monosilane ($SiH_4$), hydrogen ($H_2$), and argon (Ar) are used as the raw-material gas, the gas flow rate of the $SiH_4$ gas is 750 sccm (standard cubic centimeters per minute), the gas flow rate of the $H_2$ gas is 9 SLM (standard liters per minute), and the gas flow rate of Ar is 1.5 SLM, the film-formation temperature is 550° C., the pressure is 18 Torr (approximately 2.4 KPa), the high-frequency power is 600 W, and the film formation rate is 400 nm/minute.

Second amorphous silicon film 301B having a thickness of 1 μm is next grown by a thermal CVD method on the upper surface of first amorphous silicon film 301A. In this thermal CVD method, monosilane ($SiH_4$) and nitrogen ($N_2$) are used as the raw-material gas, the gas flow rate of the $SiH_4$ is 2 SLM, the gas flow rate of the $N_2$ is 5 sccm, the film-formation temperature is 530° C., the pressure is 90 Pa, and the film formation rate is 2 nm/minute. There are also cases in which phosphorus (P) is doped in second amorphous silicon film 301B, and when phosphorus is doped, phosphine ($PH_3$) is added to the raw-material gas to form the film.

In the following explanation, first amorphous silicon film 301A and second amorphous silicon film 301B are together referred to as amorphous silicon film 301.

Amorphous silicon film 301 is formed not only in memory cell region 100A but also in peripheral circuit region 100B. As a result, amorphous silicon film 301 that is formed in peripheral circuit region 100B is removed by a photolithography method and a dry-etching method to expose stopper insulating film 110.

A silicon oxide film is next formed by a CVD method to embed amorphous silicon film 301 on the upper surface of stopper insulating film 110.

When forming the silicon oxide film so as to embed amorphous silicon film 301, the silicon oxide film is also formed on the upper surface of second amorphous silicon film 301B. As a result, the silicon oxide film is leveled by means of a CMP method until second amorphous silicon film 301B is exposed, whereby peripheral insulating film 120 is formed in peripheral circuit region 100B.

Mask insulating film 112 composed of silicon oxide film having a thickness of 100 nm is next formed by a plasma CVD method on the upper surfaces of second amorphous silicon film 301B and peripheral insulating film 120.

Openings 302 are next formed in mask insulating film 112 by means of a photolithography method and a dry-etching method, and a portion of second amorphous silicon film 301B is exposed. When semiconductor device 100 is viewed from above, openings 302 are provided at positions that overly the positions at which contact plugs 109 are provided and the opening 302 has a diameter X7 (50 nm).

Figure 7:
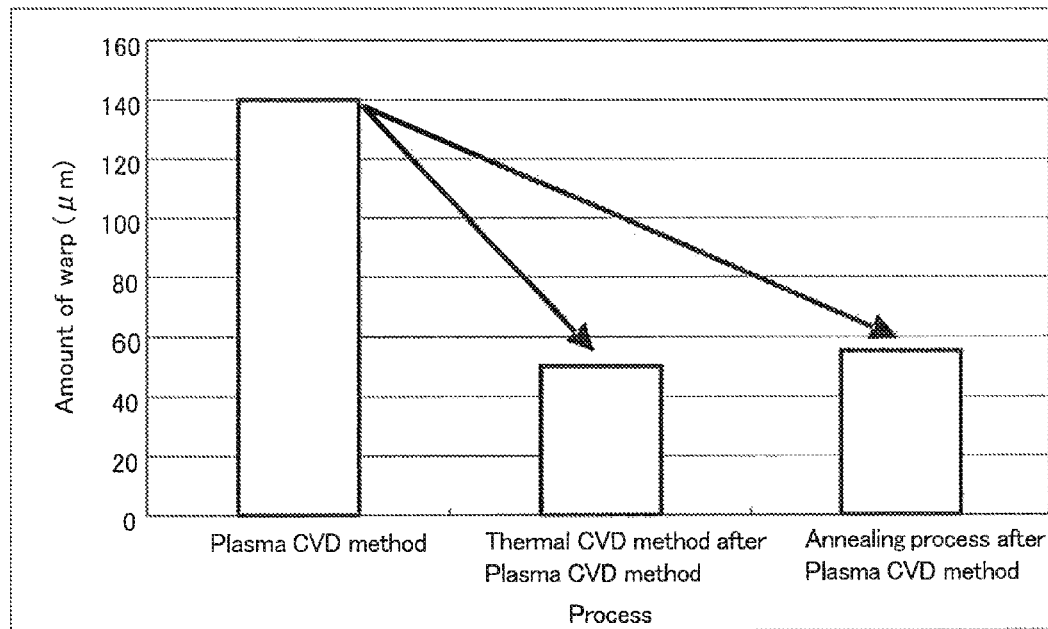
FIG. 7 shows the amount of warp of the semiconductor substrate.

Warp of the silicon substrate that occurs at the time of film formation by the plasma CVD method is next described using FIG. 7.

When an amorphous silicon film is formed by means of the plasma CVD method, warp occurs in the silicon substrate, whereby the capacitors formed on the silicon substrate may be deformed and cause the occurrence of a defect during operation of the semiconductor device of the semiconductor device. As a result, an annealing process is normally carried out to reduce the amount of warp of the silicon substrate.

FIG. 7 shows amounts of warp of a silicon substrate. These amounts of warp are actual values measured by the inventors of the invention of the present application by means of a light-interference step-measurement device using silicon wafers 300 mm in diameter.

As shown in FIG. 7, immediately following film formation of the amorphous silicon film by the plasma CVD method, the amount of warp of the silicon wafer is 140 μm. When an amorphous silicon film is further formed by a thermal CVD method after the film has been formed by using the plasma CVD method, the amount of warp of the silicon wafer is decreased to 50 μm. On the other hand, if an annealing process is carried out after the film has been formed by using the plasma CVD method, the amount of warp of the silicon wafer is decreased to 55 μm.

Thus, when film formation is further carried out by using the thermal CVD method after the film has been formed by using the plasma CVD method, the amount of warp of the silicon wafer can be reduced to an extent similar to the case in which an annealing process is carried out. This reduction of the amount of warp in a silicon wafer comes about because the heat applied at the time of film formation by the thermal CVD method exerts the same effect as an annealing process.

In the present exemplary embodiment, second amorphous silicon film 301B is formed by a thermal CVD method on the upper surface of first amorphous silicon film 301A that was formed by a plasma CVD method. As a result, the warping of silicon substrate 101 that occurs at the time of film formation by the plasma CVD method can be reduced without carrying out an annealing process.

Figure 4A:
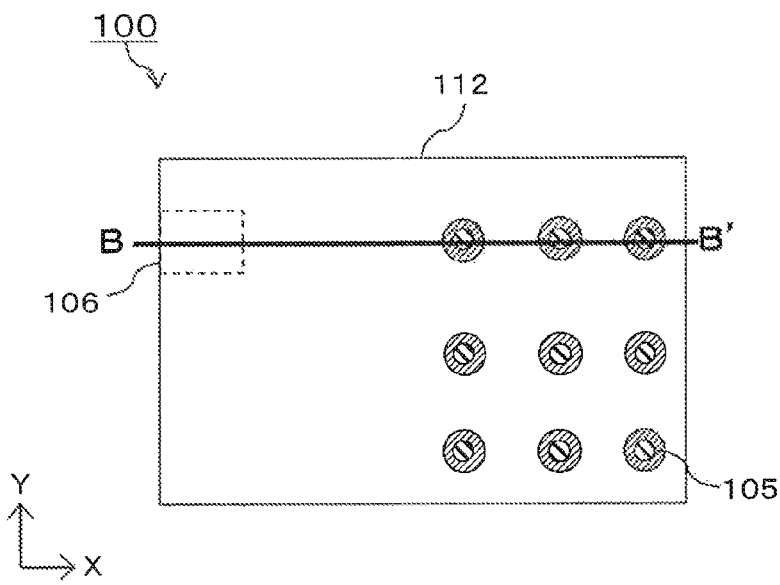
FIG. 4A is a top view in a fabrication step of the semiconductor device shown in FIG. 1A.
Figure 4B:
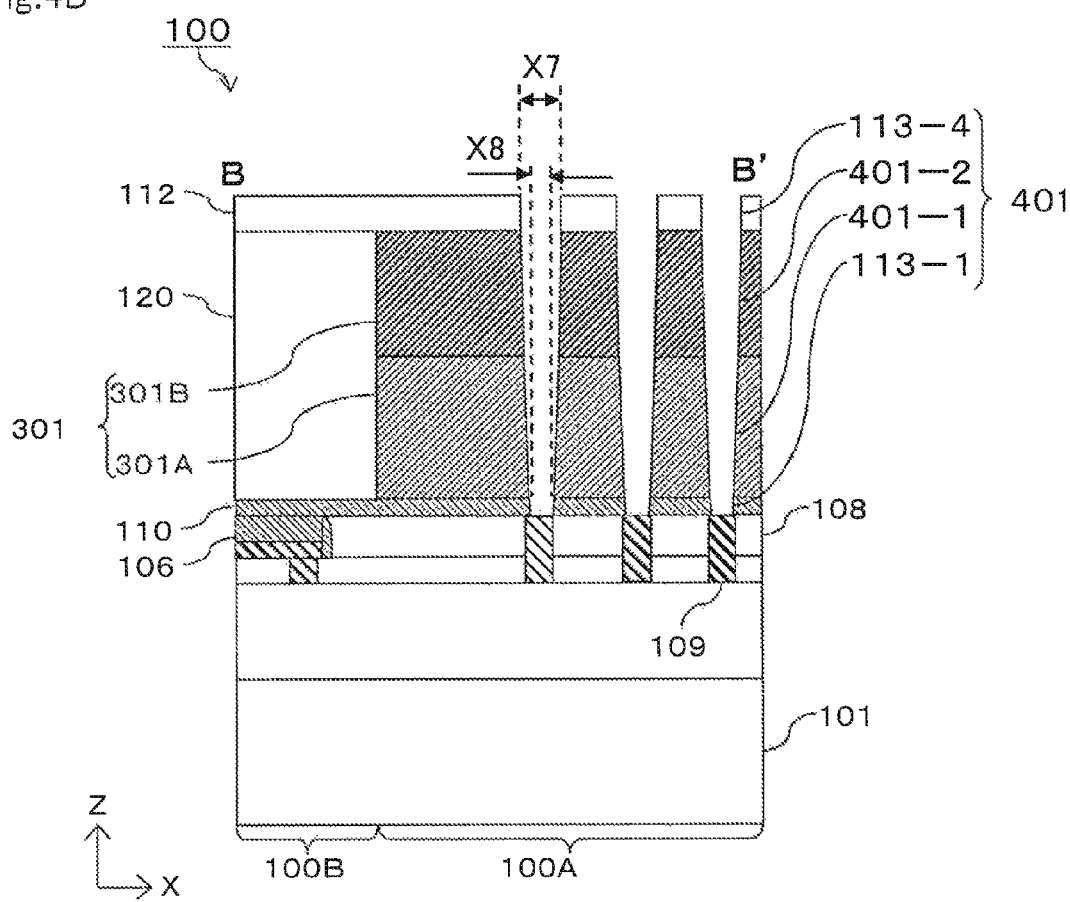
FIG. 4B is a sectional view taken along line B-B' shown in FIG. 4A.

Next, referring to FIGS. 4A and 4B, a through-hole forming step for forming through-holes 401 is carried out. More specifically, third openings (not shown) that pass through second amorphous silicon film 301B and first amorphous silicon film 301A at the positions at which openings 302 were formed are formed by means of a dry-etching method that uses mask insulating film 112 as a mask, and portions of stopper insulating film 110 are exposed.

Stopper insulating film 110 that is exposed by the third openings is next removed by a dry-etching method to form through-holes 401. Through-holes 401 that are thus formed expose contact plugs 109.

Through-holes 401 are formed so as to pass through mask insulating film 112, amorphous silicon film 301, and stopper insulating film 110.

In the following explanation, after formation of through-holes 401, the openings of first amorphous silicon film 301A are referred to as first silicon film openings 401-1, and the openings of second amorphous silicon film 301B in through-holes 401 are referred to as second silicon film openings 401-2. In addition, after the formation of through-holes 401, the openings of stopper insulating film 110 are stopper insulating film openings 113-1 and the openings of mask insulating film 112 are mask insulating film openings 113-4, similar to cylindrical holes 113.

Through-holes 401 are formed such that the diameter grows smaller in the downward direction, the upper opening diameter being 50 nm (diameter X7) and the lower opening diameter being 43 nm (diameter X8). In addition, through-holes 401 have a height of 2.15 μm. Through-holes 401 therefore are of a configuration that have a high aspect ratio with opening diameters in the nano-order and height in the micro-order.

Figure 5A:
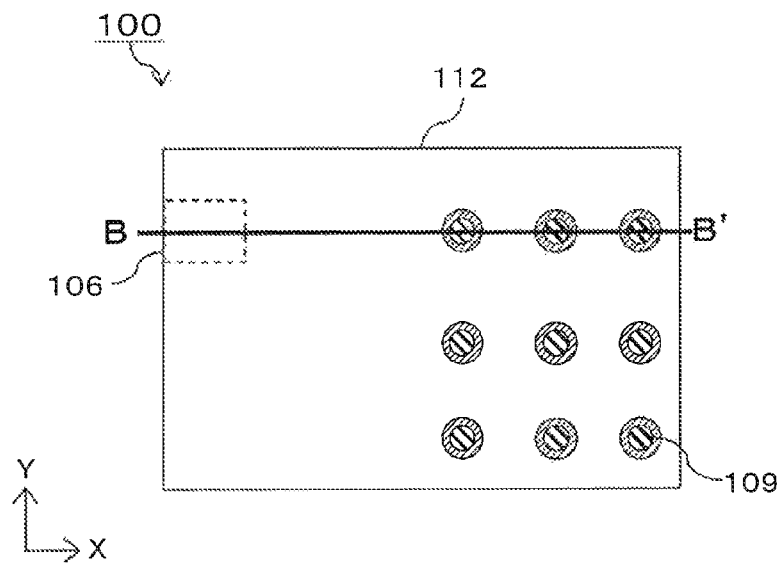
FIG. 5A is a top view showing a fabrication step of the semiconductor device shown in FIG. 1A.
Figure 5B:
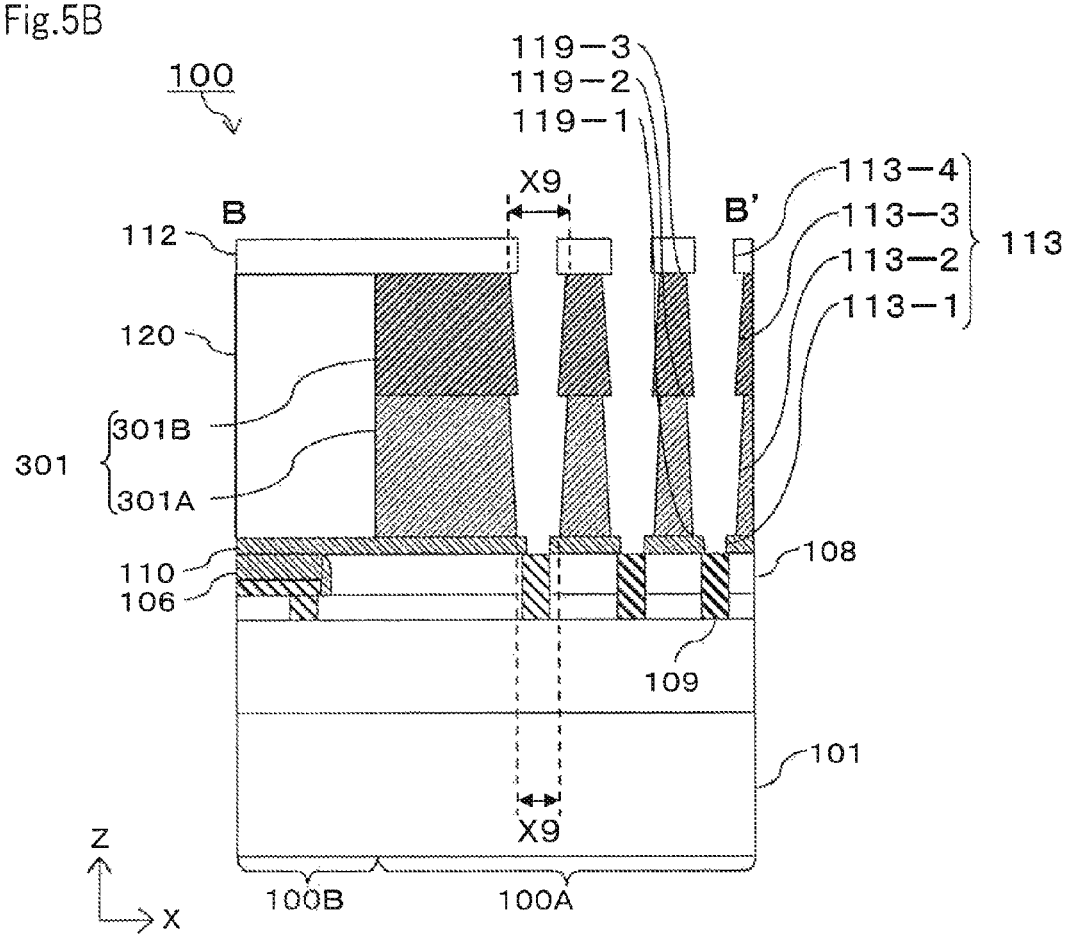
FIG. 5B is a sectional view taken along line B-B' shown in FIG. 5A.

Next, referring to FIGS. 5A and 5B, a cylindrical hole formation step is carried out in which an alkaline aqueous solution is used to form cylindrical holes 113. More specifically, the diameters of first silicon film openings 401-1 and second silicon film openings 401-2 are enlarged by means of a wet-etching process that uses a 0.5% ammonia aqueous solution ($NH_3+H_2O$) containing $NH_4^+$ (ammonium ions) and $OH^-$ (hydroxide ions) to form cylindrical holes 113.

Cylindrical holes 113 are made up of stopper insulating film openings 113-1, first silicon film openings 113-2 in which the diameter of first silicon film openings 401-1 has been enlarged, second silicon film openings 113-3 in which the diameter of second silicon film openings 401-2 has been enlarged, and mask insulating film openings 113-4.

The silicon nitride film that makes up stopper insulating film 110 and the silicon oxide film that makes up mask insulating film 112 are not subjected to etching by the above-described wet-etching process. Accordingly, the diameters of stopper insulating film openings 113-1 and mask insulating film openings 113-4 are not enlarged by the wet-etching process.

In addition, the etching rate of first amorphous silicon film 301A at the time of the wet-etching process is faster than that of second amorphous silicon film 301B. As a result, the amount of enlargement of the diameter from first silicon film openings 401-1 to first silicon film openings 113-2 is greater than the amount of enlargement from second silicon film openings 401-2 to second silicon film openings 113-3.

Accordingly, the upper opening diameter of stopper insulating film openings 113-1 is smaller than the lower opening diameter of first silicon film openings 113-2, and the side surfaces of stopper insulating film openings 113-1 are not continuous with the side surfaces of first silicon film openings 113-2, but rather, form stepped portions 119-1.

In addition, the upper opening diameter of first silicon film openings 113-2 is greater than the lower opening diameter of second silicon film openings 113-3, and second amorphous silicon film 301B overhangs first amorphous silicon film 301A and thus forms stepped portions 119-2.

In addition, the upper opening diameter of second silicon film openings 113-3 is greater than the lower opening diameter of mask insulating film openings 113-4, and mask insulating film 112 overhangs second amorphous silicon film 301B and forms stepped portions 119-3.

In this way, stepped portions 119-1-119-3 are formed on the inner surfaces of cylindrical hole 113, whereby the inner surfaces are formed in a saw-tooth shape. In addition, cylindrical holes 113 are of a configuration with a high aspect ratio similar to through-holes 401.

Figure 8:
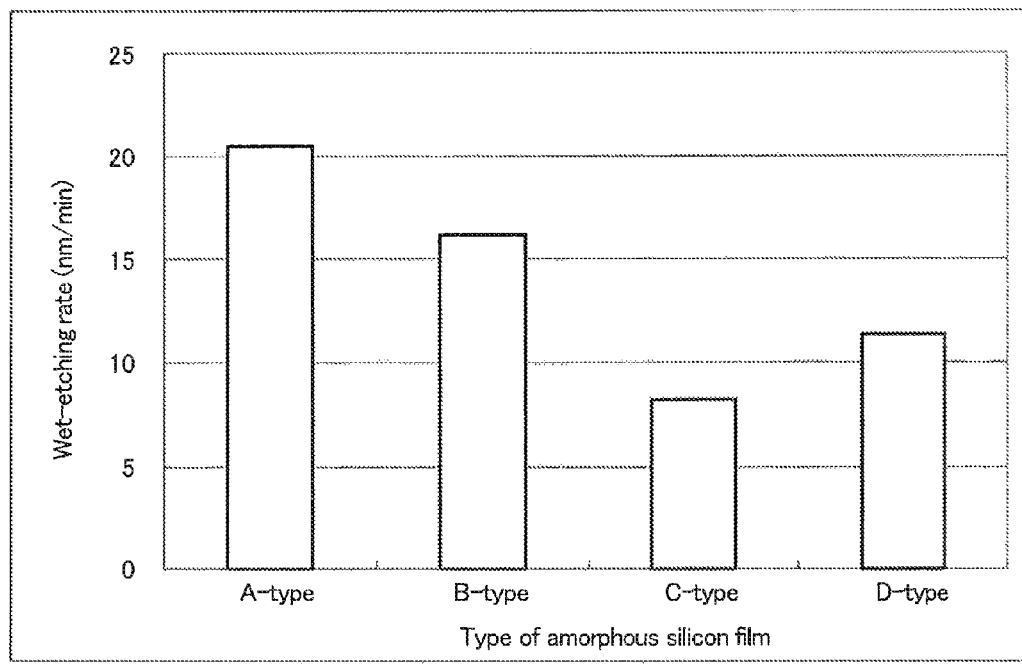
FIG. 8 shows the rate of wet etching of an amorphous silicon film.

The differences in the amounts of enlargement of the diameters of first silicon film openings 401-1 and second silicon film openings 401-2 are next described using FIG. 8.

FIG. 8 shows the etching rates of an amorphous silicon film when subjected to wet etching that uses a 0.5% ammonia aqueous solution.

An A-type amorphous silicon film is an amorphous silicon film formed by a plasma CVD method and corresponds to first amorphous silicon film 301A. A B-type amorphous silicon film is an amorphous silicon film that is formed by a plasma CVD method in which, of the formation conditions of first amorphous silicon film 301A, only the film-formation temperature is changed to 540° C. A C-type amorphous silicon film is an amorphous silicon film that is formed by a thermal CVD method and corresponds to second amorphous silicon film 301B. A D-type amorphous silicon film is an amorphous silicon film formed by a thermal CVD method in which phosphorus (P) is doped in second amorphous silicon film 301B.

As shown in FIG. 8, the wet-etching rate of an A-type amorphous silicon film is 20 nm/minute. When the wet-etching process is carried out for 18 seconds, first silicon film opening 401-1 that is formed in first amorphous silicon film 301A is enlarged by 12 nm.

The wet-etching rate of a C-type amorphous silicon film is 8 nm/minute and is therefore slower than that of the A-type amorphous silicon film. When the wet-etching process is carried out for 18 seconds, second silicon film openings 401-2 that are formed in second amorphous silicon film 301B are enlarged by 5 nm.

In this way, the amount of enlargement from first silicon film openings 401-1 to first silicon film openings 113-2 is greater than the amount of enlargement from second silicon film openings 401-2 to second silicon film openings 113-3.

The processing time of wet etching in the present exemplary embodiment is 18 seconds. As a result, the lower opening diameter of first silicon film openings 113-2 is enlarged from 43 nm (diameter X8) to 55 nm (diameter X9), and the upper opening diameter of second silicon film openings 113-3 is enlarged from 50 nm (diameter X7) to 55 nm (diameter X9), as shown in FIGS. 4B and 5B. Accordingly, the lower opening diameter of first amorphous silicon film 301A and the upper opening diameter of second amorphous silicon film 301B are both 55 nm (diameter X9).

The wet-etching rate of a B-type amorphous silicon film is 16 nm/minute, and the wet-etching rate of a D-type amorphous silicon film is 11 nm/minute. As a result, the wet-etching rate of first amorphous silicon film 301A is a rate that depends on the film-formation temperature of first amorphous silicon film 301A. In addition, the wet-etching rate of second amorphous silicon film 301B is a rate that depends on the amount of phosphorus doping of second amorphous silicon film 301B.

Figure 6A:
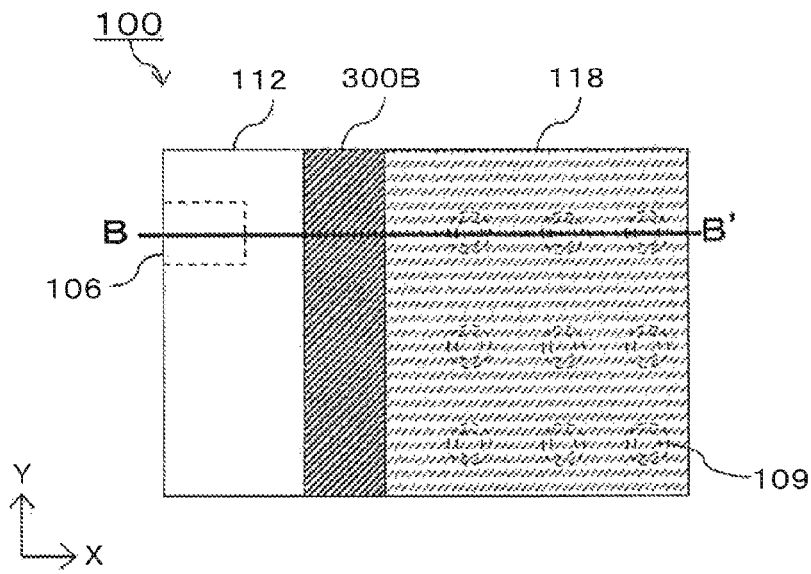
FIG. 6A is a top view in a fabrication step of the semiconductor device shown in FIG. 1A.
Figure 6B:
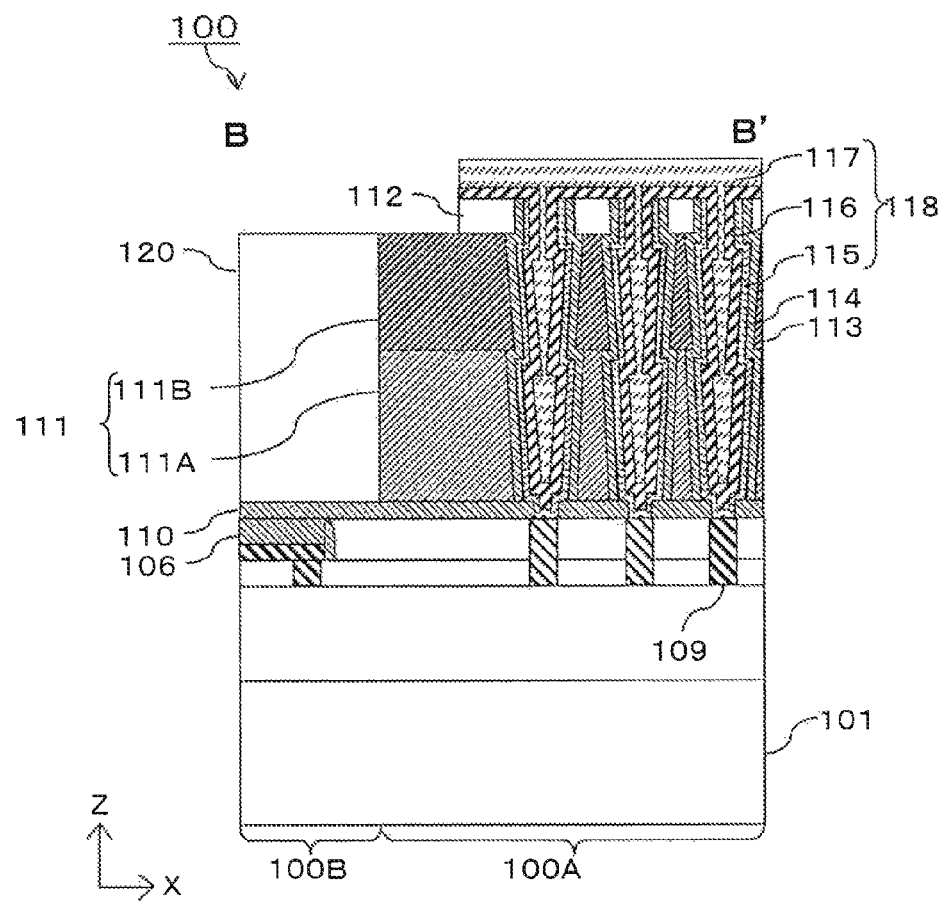
FIG. 6B is a sectional view taken along line B-B' shown in FIG. 6A.

Referring next to FIGS. 6A and 6B, a reforming step is carried out of reforming amorphous silicon film 301 into cylinder interlayer film 111. More specifically, all of semiconductor device 100 is subjected to heat treatment at 600° C., and amorphous silicon film 301 that is amorphous silicon is reformed into cylinder interlayer film 111 that is polycrystalline silicon film.

In other words, first amorphous silicon film 301A is reformed into first polycrystalline silicon film 111A, and second amorphous silicon film 301B is reformed into second polycrystalline silicon film 111B. This heat treatment may be implemented independently, or may be implemented by applying heat of at least 600° C. in a heat treatment at the time of subsequent film formation.

A first insulating film formation step for forming sidewall insulating film 114 is next carried out. More specifically, a silicon nitride film is formed by a CVD method to cover the inner surfaces of cylindrical holes 113. At this time, a silicon nitride film having a fixed thickness is formed on the inner surfaces of cylindrical holes 113 without filling cylindrical holes 113. The silicon nitride film is also formed on the upper surfaces of mask insulating film 112, second polycrystalline silicon film 111B, and peripheral insulating film 120.

Etching is next carried out in the Z-direction by means of an anisotropic dry-etching method to remove the silicon nitride film that was formed on the upper surfaces of mask insulating film 112, second polycrystalline silicon film 111B, and peripheral insulating film 120 and stopper insulating film opening 113-1. In this way, sidewall insulating film 114 is formed in which stepped portions are formed on the inner surfaces so as to cover the inner surfaces of first silicon film openings 113-2, second silicon film openings 113-3, and mask insulating film openings 113-4.

In the present exemplary embodiment, sidewall insulating film 114 is formed by a silicon nitride film (SiN), but sidewall insulating film 114 may also be formed by a single layer of aluminum oxide film (AlO) or zirconium oxide film (ZrO) or by a layered film of these films.

A lower electrode formation step of forming lower electrode 115 is next carried out. More specifically, lower electrode 115 composed of titanium nitride (TiN) having a thickness of 10 nm is formed by a CVD method to cover the inner surfaces of stopper insulating film openings 113-1 and sidewall insulating film 114.

As with sidewall insulating film 114, stepped portions are formed on the inner surfaces of lower electrodes 115. In addition, lower electrodes 115 need not be made of titanium nitride and may be constituted from a metal such as ruthenium (Ru) or platinum (Pt).

When forming lower electrodes 115 that are composed of titanium nitride so as to cover the inner surfaces of stopper insulating film openings 113-1 and sidewall insulating film 114, titanium nitride film is also formed on the upper surfaces of peripheral insulating film 120, second polycrystalline silicon film 111B, and mask insulating film 112. The titanium nitride film that was formed on the upper surfaces of peripheral insulating film 120, second polycrystalline silicon film 111B, and mask insulating film 112 is removed by a CMP method.

A second insulating film formation step of forming capacitive insulating film 116 is next carried out. More specifically, capacitive insulating film 116 that is composed of an insulator is formed by a CVD method or an ALD (Atomic Layer Deposition) method so as to cover the inner surfaces and upper surfaces of lower electrodes 115 that are exposed and the upper surfaces of mask insulating film 112 and sidewall insulating film 114.

Capacitive insulating film 116 may be made up of a high-dielectric film such as zirconium oxide ($ZrO_2$), aluminum oxide ($Al_2O_3$), or hafnium oxide ($HfO_2$) or from a laminated film mdee of these materials.

An upper electrode formation step of forming upper electrodes 117 is next carried out. More specifically, upper electrodes 117 composed of titanium nitride are formed so as to cover the inner surfaces and upper surface of capacitive insulating film 116 as well as to fill the inside of cylindrical holes 113.

Upper electrodes 117 may consist of a laminated structure in which titanium nitride of a thickness in the order of 10 nm is formed so as to cover the inner surface of capacitive insulating film 116, then filling the inside of cylindrical hole 113 by laminating a polysilicon film in which impurity is doped, and then forming tungsten to a thickness in the order of 100 nm on the upper surfaces of cylindrical holes 113. Upper electrodes 117 may consist of metal such as ruthenium or platinum.

Mask insulating film 112, capacitive insulating film 116, and upper electrodes 117 are next removed from peripheral circuit region 100B and a portion of memory cell region 100A in the vicinity of peripheral circuit region 100B by a photolithography method and a dry-etching method. In this way, upper electrodes 117, capacitive insulating film 116, and mask insulating film 112 are left on a portion of memory cell region 100A.

When the fabrication steps shown in FIGS. 6A and 6B are completed, a silicon oxide film is formed so as to bury peripheral insulating film 120, second polycrystalline silicon film 111B, mask insulating film 112, capacitive insulating film 116, and upper electrodes 117. The upper surface of the silicon oxide film that was formed is further leveled by a CMP method to form fourth interlayer dielectric film 121.

Fourth opening (not shown) that passes through fourth interlayer dielectric film 121 to reach upper electrode 117, fifth opening (not shown) that passes through fourth interlayer dielectric film 121 to reach second polycrystalline silicon film 111B, and sixth opening (not shown) that passes through fourth interlayer dielectric film 121, peripheral insulating film 120, stopper insulating film 110, and wiring insulating film 106 to reach wiring 105 are next formed by a photolithography method and a dry-etching method.

Contact plug 122 in the fourth opening, contact plug 123 in the fifth opening and contact plug 124 in the sixth opening are next formed by a method similar to the fabrication method of a typical semiconductor device.

Upper electrode power-supply wiring 125 that connects with contact plug 116, cylinder interlayer film power-supply wiring 126 that connects with contact plug 122, and wiring 127 that connects with contact plug 127 are next formed.

A surface protection film (not shown) is next formed on the upper surface of fourth interlayer dielectric film 121 so as to cover upper electrode power-supply wiring 125, cylinder interlayer film power-supply wiring 126, and wiring 127.

By proceeding through the above-described steps, semiconductor device 100 is completed.

Although the explanation in the present exemplary embodiment used an example in which two amorphous silicon films (first amorphous silicon film 301A and second amorphous silicon film 301B) having different etching rates were formed in the lamination step, the present invention is not limited to this form. Three or more amorphous silicon films each having different wet-etching rates may also be formed. In such cases, the amorphous silicon film having the slowest wet-etching rate is laminated on the uppermost layer in the lamination step.

Although the explanation in the present exemplary embodiment used an example in which the etching rate of first amorphous silicon film 301A was varied according to the film-formation temperature in the plasma CVD method for forming first amorphous silicon film 301A, the present invention is not limited to this form. The etching rate may also be altered according to film formation conditions other than the film-formation temperature, such as pressure or high-frequency power.

Although the explanation in the present exemplary embodiment used an example in which the etching rate of second amorphous silicon film 301B was altered according to the amount of doping of phosphorus in the thermal CVD method for forming second amorphous silicon film 301B, the present invention is not limited to this form. When arsenic or boron is doped as the impurity, the etching rate may be altered according to the doping amount of these impurities.

Thus, in the present exemplary embodiment, two amorphous silicon films are laminated on a silicon substrate and through-holes 401 are formed that pass through each of the laminated amorphous silicon films. Cylindrical holes 113 are then formed by subjecting the inner surfaces of through-holes 401 to an etching process in the cylindrical hole formation step. Because the etching rate of each amorphous silicon film differs, at the openings of each amorphous silicon film, the amount of enlargement of the diameter that results from etching also differs. As a result, the side surfaces of adjacent openings are not mutually continuous and stepped portions are formed on the inner surfaces of cylindrical holes 113 that are formed, whereby the area of the inner surfaces of cylindrical holes 113 is increased.

In addition, through-holes 401 have an inverted truncated conical shape, whereby the opening diameter of second silicon film openings 401-2 is greater than the opening diameter of first silicon film openings 401-1. In addition, the wet-etching rate of second amorphous silicon film 301B is slower than that of first amorphous silicon film 301A, whereby the amount of enlargement of the diameter resulting from etching is smaller in second silicon film openings 401-2 than in first silicon film openings 401-1. Reducing the amount of enlargement in the second silicon film openings 401-2, that have a larger diameter, and the smaller diameter before etching of first silicon film openings 401-1 that have a greater amount of enlargement enable preventing of increase in the area occupied by cylindrical holes 113 that are formed.

Accordingly, the formation of cylindrical holes 113, whose inner surfaces have a greater area, while any increase in the size of the area occupied by cylindrical holes 113 is prevented, enables preventing any decrease in the capacitance of the capacitor that accompanies a decrease in the size of the area occupied by the capacitors.

In the present exemplary embodiment, moreover, first amorphous silicon film 301A is formed by a plasma CVD method, following which second amorphous silicon film 301B is formed by a thermal CVD method. In the thermal CVD method, semiconductor device 100 is heated similarly to an annealing process, whereby the amount of warp of silicon substrate 101 can be reduced without carrying out an annealing process for decreasing the amount of warp of silicon substrate 101. As a result, not only can a simplification of the fabrication method be achieved, but fabrication defects can also be decreased by preventing deformation of capacitors 118.

In the present exemplary embodiment, moreover, it is shown that the etching rate of first amorphous silicon film 301A is a rate that depends on the film-formation conditions of first amorphous silicon film 301A, and the etching rate of second amorphous silicon film 301B is a rate that depends on the amount of doping of second amorphous silicon film 301B. By controlling the etching time according to the etching rate of each amorphous silicon film to set the diameter of each opening to the desired size, cylindrical holes 113 can be made the desired size. As a result, the area occupied by capacitors 118 and the capacitor capacitance can be made the desired values.

In the present exemplary embodiment, moreover, an inner capacitor that is inside lower electrode 115 and an outer capacitor that is outside lower electrode 115 are formed, and the capacitors in semiconductor device 100 have a crown structure. As a result, the capacitance of capacitor 118 is large even though the area that it occupies is small.

Second Exemplary Embodiment

The semiconductor device of the second exemplary embodiment of present invention is next described.

Figure 9:
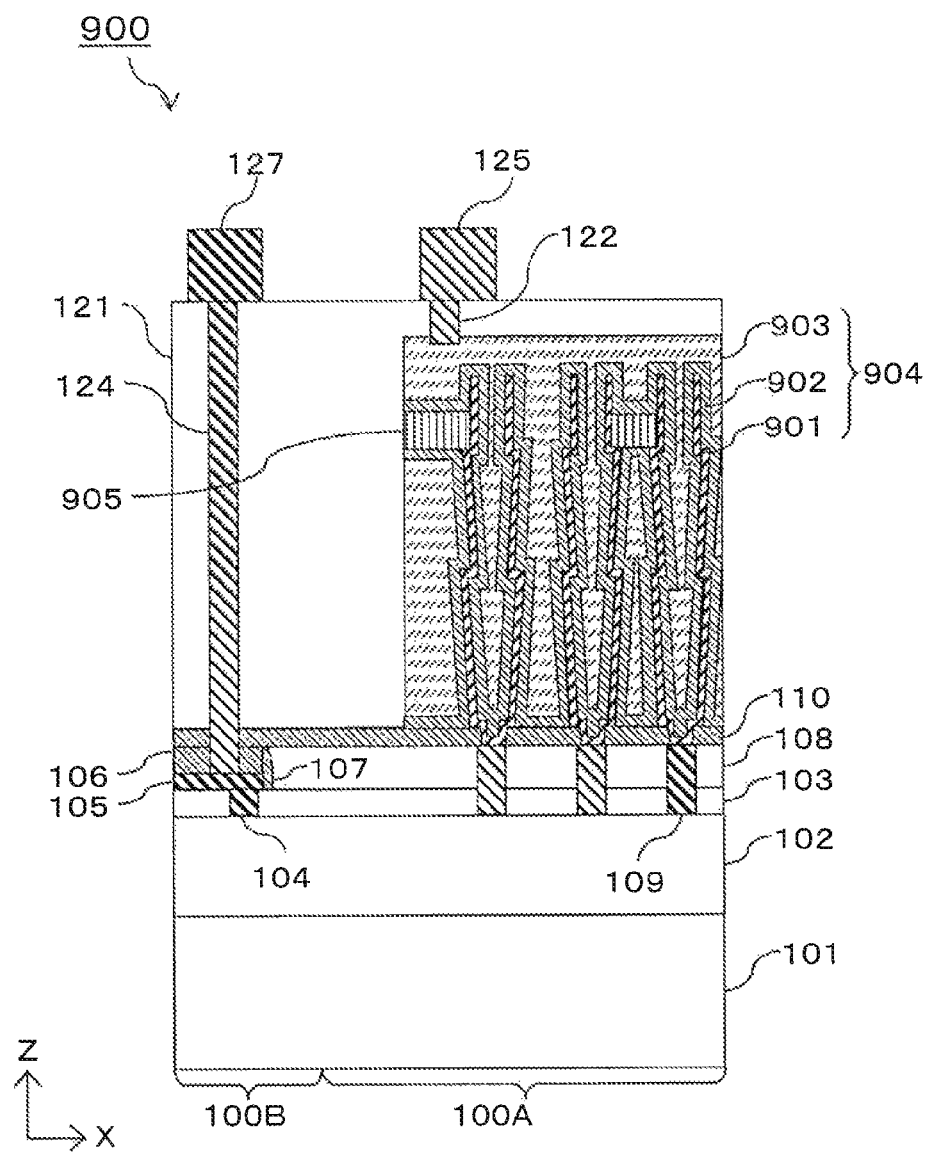
FIG. 9 is a sectional view of the semiconductor device of the second exemplary embodiment of the present invention.

FIG. 9 is a sectional view of semiconductor device 900 of the second exemplary embodiment of the present invention. In the following explanation, constructions identical to those of semiconductor device 100 are given the same reference numbers and redundant explanation is here omitted.

As shown in FIG. 9, lower electrodes 901, capacitive insulating films 902, upper electrodes 903, and support film 905 are formed on the upper surface of stopper insulating film 110 in memory cell region 100A. Capacitors 904 are each made up of lower electrode 901, capacitive insulating film 902, and upper electrode 903.

Lower electrodes 901 in which stepped portions are provided on the inner surfaces are formed so as to connect with contact plugs 109 that are exposed by the openings of stopper insulating film 110.

Support film 905 is formed so as to connect with a portion of the side surfaces of lower electrodes 901. A portion of support film 905 is provided between lower electrodes 901.

Capacitive insulating film 902 is formed so as to cover all of lower electrodes 901, the upper surface and lower surface of support film 905, and the portion of memory cell region 100A on the upper surface of stopper insulating film 110.

Upper electrode 903 is formed so as to fill all of capacitive insulating film 902 in a portion of memory cell region 100A.

Fourth interlayer dielectric film 121 is formed so as to embed the all of capacitors 904 and support film 905 in the upper surface of stopper insulating film 110 in a portion of memory cell region 100A.

The fabrication steps of semiconductor device 900 are next described with reference to FIGS. 10A-13B. Each of FIGS. 10A, 11A, 12A, and 13A is a top view, and each of FIGS. 10B, 11B, 12B, and 13B is a sectional view taken along lines C-C' shown in FIGS. 10A, 11A, 12A, and 13A.

In addition, explanation of fabrication steps of semiconductor device 900 that are identical to those of semiconductor device 100 is here omitted.

First interlayer dielectric film 102 to amorphous silicon film 301 are first formed on silicon substrate 101 by methods identical to the methods used in the fabrication steps shown in FIGS. 2A-3B.

Figure 10A:
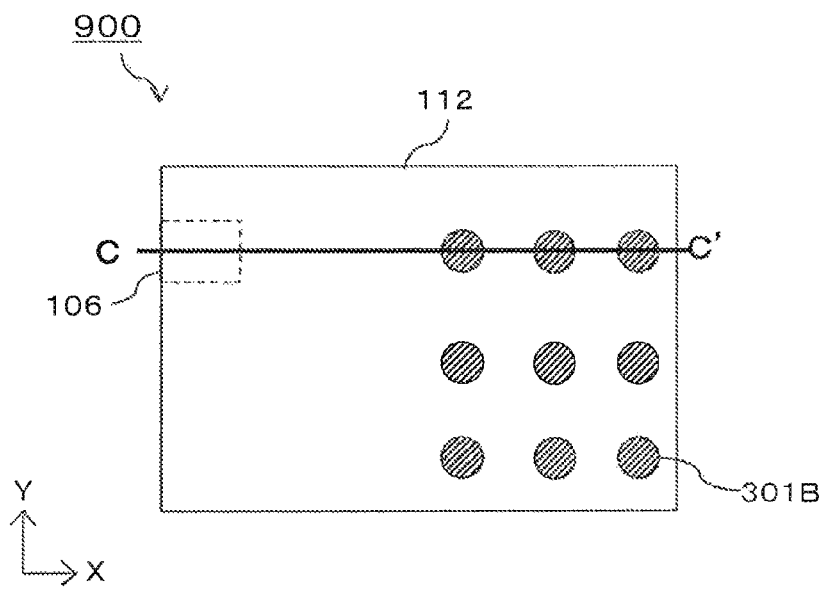
FIG. 10A is a top view in a fabrication step of the semiconductor device shown in FIG. 9.
Figure 10B:
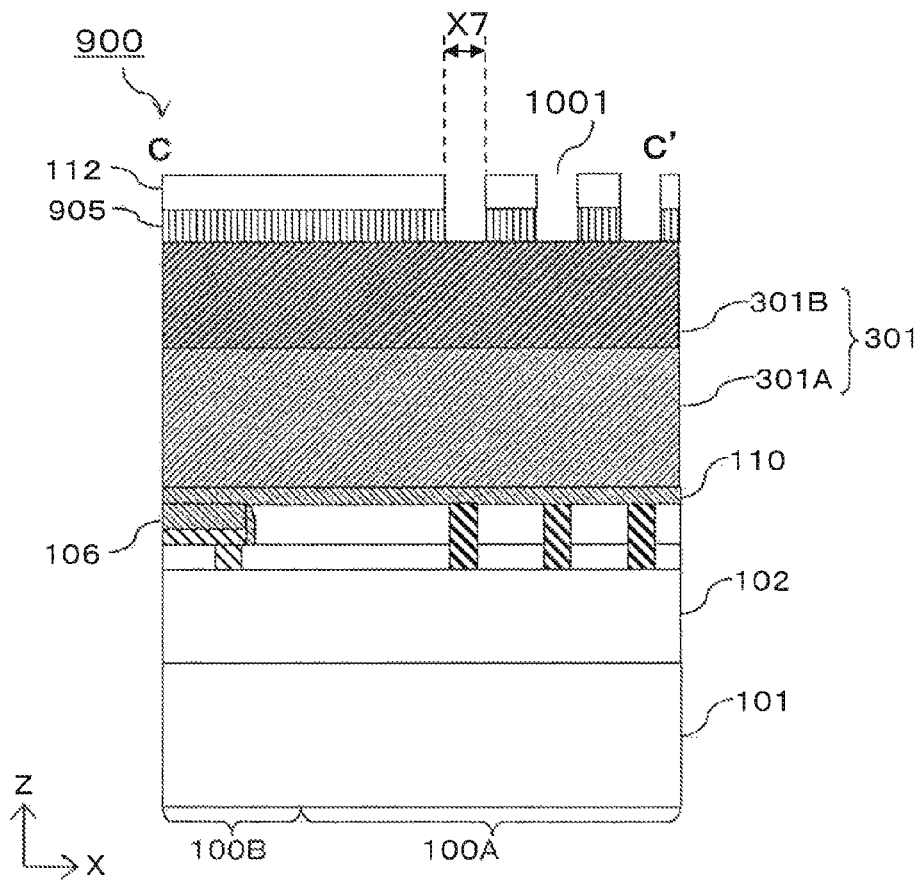
FIG. 10B is a sectional view taken along line C-C' shown in FIG. 10A.

Referring to FIGS. 10A and 10B, support film 905 composed of silicon nitride film and having a thickness of 50 nm is next formed on the upper surface of second amorphous silicon film 301B by means of a plasma CVD method.

Mask insulating film 112 composed of silicon oxide film and having a thickness of 100 nm is next formed on the upper surface of support film 905 by a plasma CVD method.

Openings 1001 of the same size (diameter X7=50 nm) as openings 302 and that pass through mask insulating film 112 and support film 905 are formed by a photolithography method and a dry-etching method at positions equivalent to the positions at which openings 302 were formed.

Figure 11A:
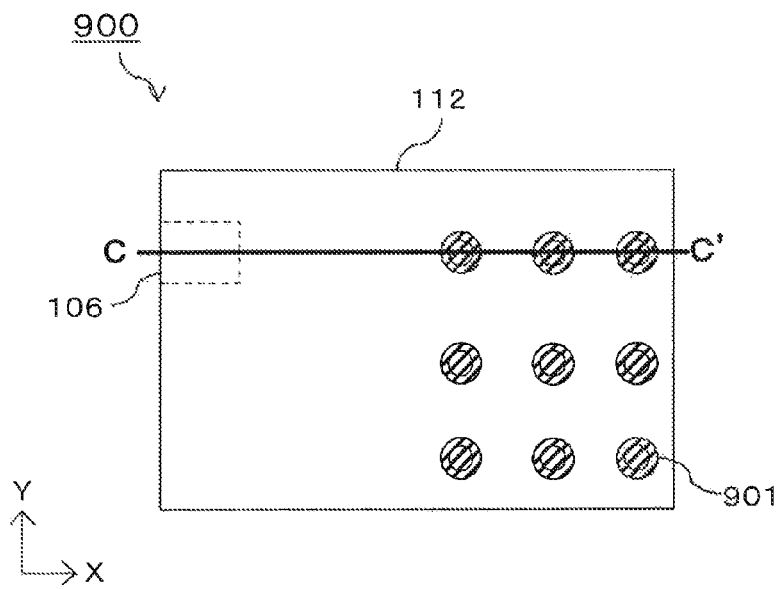
FIG. 11A is a top view in a fabrication step of the semiconductor device shown in FIG. 9.
Figure 11B:
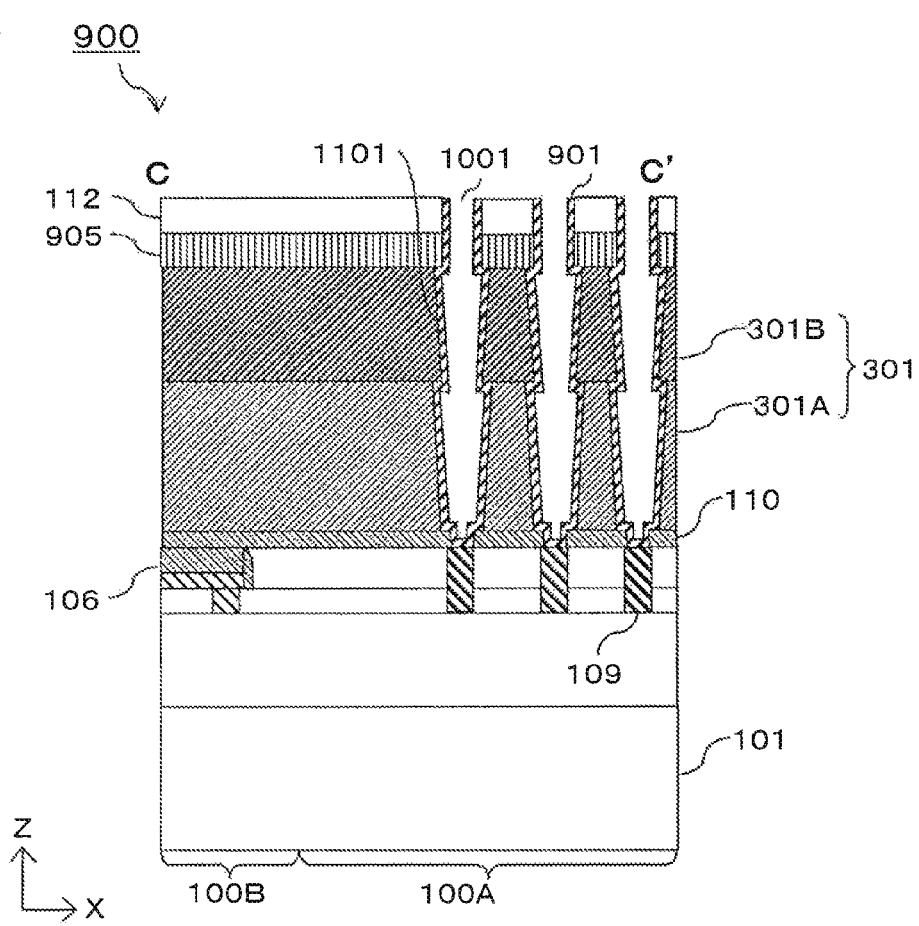
FIG. 11B is a sectional view taken along line C-C' shown in FIG. 11A.

Referring to FIGS. 11A and 11B, cylindrical holes 1101 in which stepped portions are provided on inner surfaces and that pass through mask insulating film 112, support film 905, amorphous silicon films 301, and stopper insulating film 110 are next formed by methods identical to the methods used in the fabrication steps shown in FIGS. 4A-5B.

A lower electrode formation step is next carried out to form lower electrodes 901. More specifically, lower electrodes 901 composed of titanium nitride film and having thickness of 10 nm are formed by a CVD method so as to cover the inner surfaces of cylindrical holes 1101.

When forming lower electrodes 901 composed of titanium nitride film so as to cover the inner surfaces of cylindrical holes 1101, the titanium nitride film is also formed on the upper surface of mask insulating film 112, and the titanium nitride film that has formed on mask insulating film 112 is therefore removed by a CMP method.

Figure 12A:
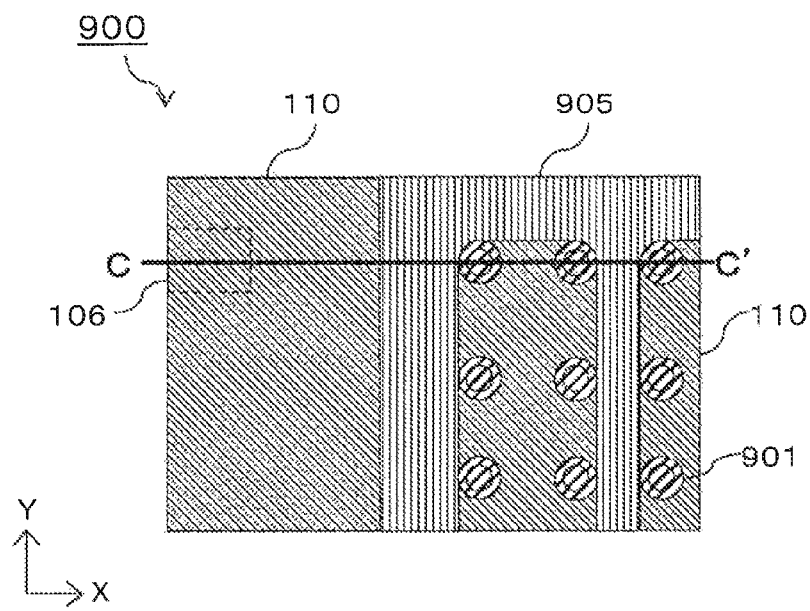
FIG. 12A is a top view in a fabrication step of the semiconductor device shown in FIG. 9.
Figure 12B:
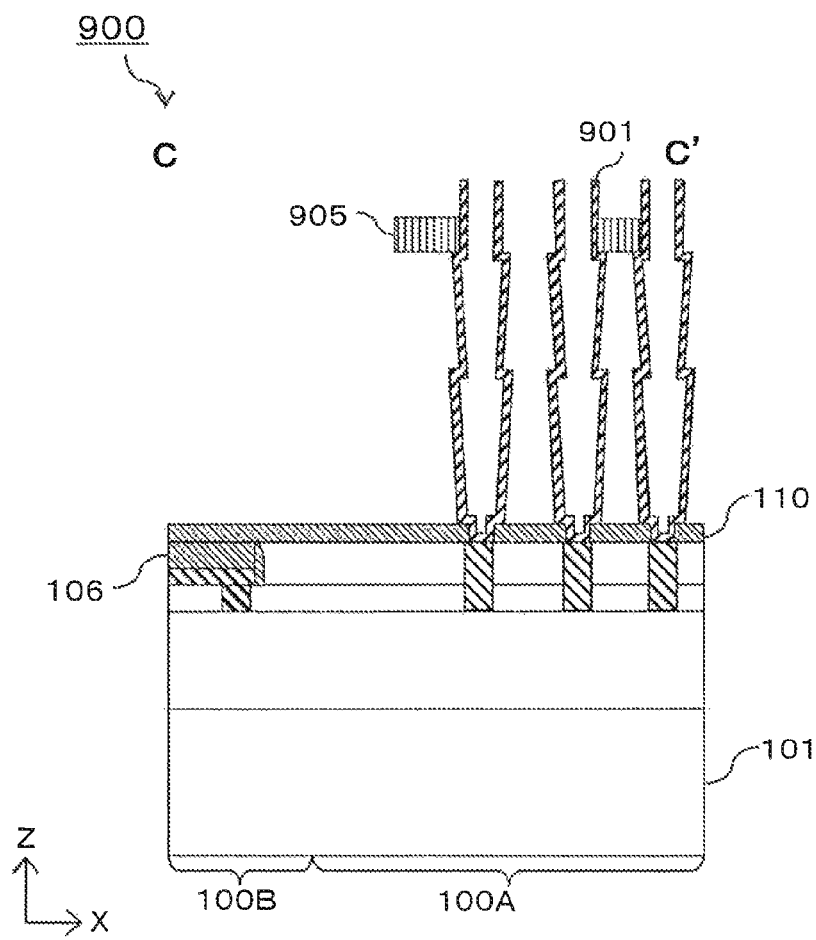
FIG. 12B is a sectional view taken along line C-C' shown in FIG. 12A.

Next, referring to FIGS. 12A and 12B, a portion of mask insulating film 112 and support film 905 is removed to form a seventh opening (not shown), and a portion of second amorphous silicon film 301B is exposed. The seventh opening extends in the Y-direction and, when semiconductor device

900 is viewed from above, is provided at a position that overlies the position shown by stopper insulating film 110 in FIG. 12A.

An amorphous silicon film removal step is next carried out to remove amorphous silicon film 301. More specifically, mask insulating film 112 that is composed of silicon oxide film and amorphous silicon film 301 are removed by using a wet-etching method that uses nitrohydrofluoric solution, which is a mixed solution of hydrofluoric acid (HF) and nitride acid ($HNO_3$). Because the nitrohydrofluoric solution also penetrates below support film 905, amorphous silicon film 301 that is positioned below support film 905 is also removed, and a portion of the outer surface of lower electrode 901 is exposed.

Stopper insulating film 110 and support film 905 that are composed of silicon nitride film and lower electrodes 901 that are composed of titanium nitride film all remain in the same state as before wet etching without being etched. Because of the portion of support film 905 that remains between lower electrodes 901, lower electrodes 901 support each other by way of support film 905, and the collapse of lower electrodes 901 can therefore be prevented.

Figure 13A:
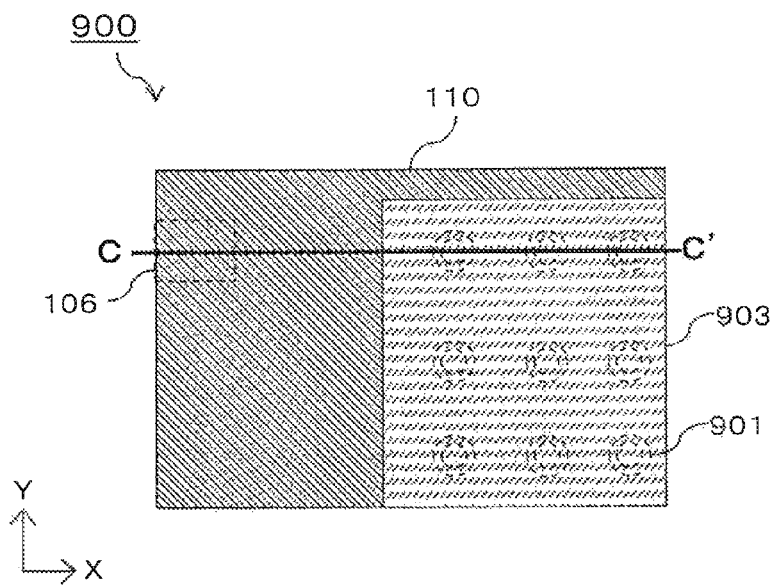
FIG. 13A is a top view in a fabrication step of the semiconductor device shown in FIG. 9.
Figure 13B:
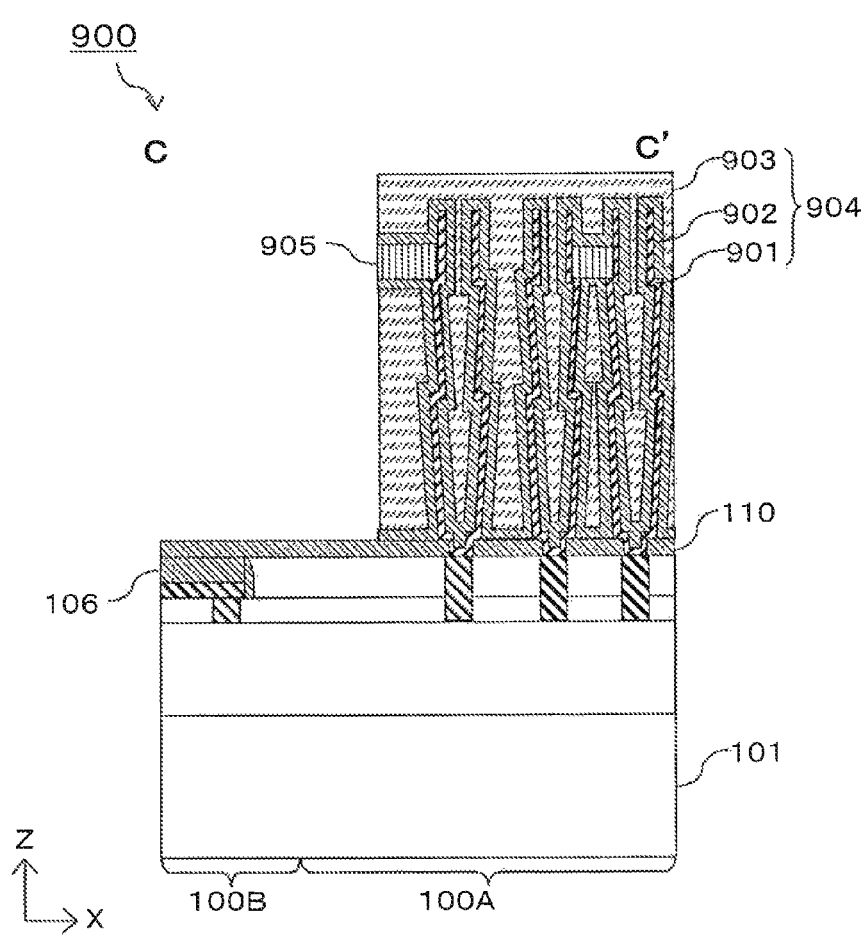
FIG. 13B is a sectional view taken along line C-C' shown in FIG. 13A.

Referring now to FIGS. 13A and 13B, an insulating film formation step is carried out to form capacitive insulating film 902. More specifically, capacitive insulating film 902 is formed so as to cover lower electrodes 901 and all of support film 905 by methods identical to the methods used in the fabrication steps shown in FIGS. 6A and 6B.

An upper electrode formation step is next carried out to form upper electrodes 903. More specifically, upper electrodes 903 are formed by methods identical to the methods used in the fabrication steps shown in FIGS. 6A and 6B so as to embed all of capacitive insulating film 902.

The titanium nitride film that was formed at the time of forming capacitive insulating film 902 and the conductive film that was formed at the time of forming upper electrodes 903 in peripheral circuit region 100B and the portion of memory cell region 100A in the vicinity of peripheral circuit region 100B are next removed by a photolithography method and a dry-etching method.

A silicon oxide film is next formed by a CVD method so as to embed capacitors 904 and support film 905, and the silicon oxide film is further leveled by a CMP method. In this way, fourth interlayer dielectric film 121 composed of the silicon oxide film is formed on the upper surface of stopper insulating film 110.

Contact plugs 122 and 124, upper electrode power-supply wiring 125, and wiring 127 are next formed by methods identical to the methods used in the fabrication steps shown in FIGS. 6A and 6B. A surface protection film (not shown) is further formed on the upper surface of fourth interlayer dielectric film 121 so as to cover upper electrode power-supply wiring 125 and wiring 127.

By proceeding through the steps described above, semiconductor device 900 is completed.

Thus, in semiconductor device 900 in the present exemplary embodiment, inner capacitors inside lower electrodes 901 are constituted by lower electrodes 901, capacitive insulating film 902 and upper electrodes 903, and further, outer capacitors outside lower electrodes 901 are constituted by lower electrodes 901, capacitive insulating film 902 and upper electrodes 903. Due to the crown construction in which capacitors in semiconductor device 900 are configured both inside and outside lower electrode 115, the area occupied by the capacitors is reduced and the capacitor capacitance of the capacitors is increased.

In the present exemplary embodiment, moreover, support film 905 is formed on the upper surface of amorphous silicon film 301 in the lamination step, cylindrical holes 1101 that pass through amorphous silicon film 301 and support film 905 are formed in the cylindrical hole formation step, and a portion of support film 905 is removed such that support film 905 remains between lower electrodes 901 in the amorphous silicon film removal step. Because support film 905 remains between lower electrodes 901 after the amorphous silicon film removal step, lower electrodes 901 support each other by way of support film 905. As a result, collapse of lower electrodes 901 that are exposed can be prevented, and fabrication defects of semiconductor device 90 can be reduced.

Third Exemplary Embodiment

The fabrication method of semiconductor device 100 according to the third exemplary embodiment of the present invention is next described. The fabrication method of semiconductor device 100 according to the present exemplary embodiment differs from the fabrication method of semiconductor device 100 according to the first exemplary embodiment with regard to the lamination step and the cylindrical hole formation step. In the following explanation, FIGS. 3A and 3B to FIGS. 5A and 5B that were used in the explanation of the first exemplary embodiment are used to explain steps from the lamination step to the cylindrical hole formation step in the fabrication method of the semiconductor device according to the present exemplary embodiment and explanation of the other steps is here omitted.

The lamination step according to the present exemplary embodiment is first described using FIGS. 3A and 3B. In the lamination step according to the present exemplary embodiment, first amorphous silicon film 301A having a thickness of 1 μm is formed by a thermal CVD method on the upper surface of semiconductor substrate 303. In this thermal CVD method, monosilane ($SiH_4$) and nitrogen ($N_2$) are used as the raw-material gas, the gas flow rate of the $SiH_4$ is 2 SLM, the gas flow rate of $N_2$ is 5 sccm, the film-formation temperature is 530° C., the pressure is 90 Pa, and the film-formation rate is 2 nm/minute.

Second amorphous silicon film 301B having a thickness of 1 μm is next formed by a plasma CVD method on the upper surface of first amorphous silicon film 301A. In this plasma CVD method, monosilane ($SiH_4$), hydrogen ($H_2$), and argon (Ar) are used as the raw-material gas, the gas flow rate of $SiH_4$ is 750 sccm, the gas flow rate of $H_2$ is 9 SLM, the gas flow rate of Ar is 1.5 SLM, the film-formation temperature is 400° C., the pressure is 18 Torr (approximately 2.4 KPa), and the high-frequency power is 600 W.

Next, the removal of amorphous silicon film 301 in peripheral circuit region 100B, the formation of peripheral insulating film 120, the formation of mask insulating film 112, and the formation of openings 302 in mask insulating film 112 are carried out as in the first exemplary embodiment.

Through-holes 401 are next formed by a dry-etching method using mask insulating film 112 as a mask, as shown in FIGS. 4A and 4B.

The cylindrical hole formation step of forming cylindrical holes 113 is next carried out as shown in FIGS. 5A and 5B. In the cylindrical hole formation step according to the present exemplary embodiment, a wet-etching method is carried out for two minutes using a mixed solution of aqueous ammonia ($NH_4OH$) and an oxidant, hydrogen peroxide water ($H_2O_2$), (APM: ammonia hydroxide-hydrogen peroxide mixture). The implementation of the wet-etching process enlarges the diameters of first silicon film openings 401-1 in first amorphous silicon film 301A and second silicon film openings 401-2 in second amorphous silicon film 301B and forms cylindrical holes 113.

The etching rate with APM is slower than for an aqueous solution of ammonia, but APM features lower dependency upon surface orientation and is less likely to leave any residue. In addition, in the present exemplary embodiment, APM is an alkaline aqueous solution containing $NH_4^+$ (ammonia ions) and $OH^-$ (hydroxide ions) and is formulated at a ratio of $NH_4OH:H_2O_2:H_2O=2:1:200$.

Figure 14:
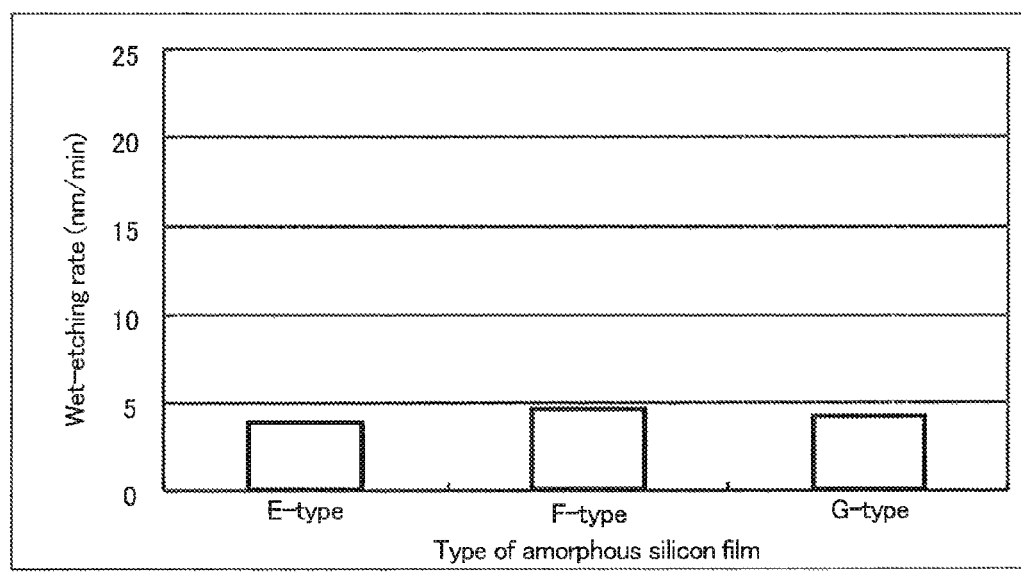
FIG. 14 shows the rate of wet etching of an amorphous silicon film.

The difference in the amounts of enlargement of the diameters of first silicon film openings 401-1 and second silicon film openings 401-2 in the cylindrical hole formation step is next described using FIG. 14.

FIG. 14 shows the etching rates when the above-described APM is used to carry out the wet-etching process on an E-type, F-type, and G-type amorphous silicon film.

A type-E amorphous silicon film is an amorphous silicon film formed at 400° C. by the plasma CVD method. A type-F amorphous silicon film is an amorphous silicon film that is formed at 530° C. by the thermal CVD method. A type-G amorphous silicon film is an amorphous silicon film that is formed at 500° C. by the thermal CVD method.

As shown in FIG. 14, the wet-etching rate of the E-type amorphous silicon film is 3.9 nm/minute. The wet-etching rate of the F-type amorphous silicon film is 4.6 nm/minute. The wet-etching rate of the G-type amorphous silicon film is 4.2 nm/minute.

In the present exemplary embodiment, first amorphous silicon film 301A is a type-F amorphous silicon film, and second amorphous silicon film 301B is a type-E amorphous silicon film. As a result, when wet etching is carried out for two minutes in the cylindrical hole formation step, the diameter of first silicon film openings 401-1 in first amorphous silicon film 301A is enlarged by 9.2 nm, and the diameter of second silicon film openings 401-2 in second amorphous silicon film 301B is enlarged by 7.8 nm. In this case, before wet etching, the diameter of first silicon film openings 401-1 is smaller than second silicon film openings 401-2. However, the amount of enlargement of the diameter due to wet etching is greater for first silicon film openings 401-1 than for second silicon film openings 401-2. Accordingly, because the amount of enlargement of the diameter is greater in first silicon film openings 401-1 that have a smaller diameter, the area of the inner surfaces of cylindrical holes 113 is increased without any increase in the area occupied by cylindrical holes 113, meaning an ideal shape is achieved.

Thus, according to the present exemplary embodiment, second amorphous silicon film 301B is formed by a plasma CVD method after forming first amorphous silicon film 301A by a thermal CVD method in the lamination step. In addition, APM is used to carry out wet etching in the cylindrical hole formation step to form the cylindrical holes.

In the lamination step according to the first exemplary embodiment, second amorphous silicon film 301B is formed by a plasma CVD method after forming first amorphous silicon film 301A by a plasma CVD method.

As a result, the ability to change the order of forming an amorphous silicon film by the plasma CVD method and forming an amorphous silicon film by the thermal CVD method in the lamination step enables an increase of the degree of freedom in the fabrication method of semiconductor device 100.

Fourth Exemplary Embodiment

The fabrication method of semiconductor device 100 according to the fourth exemplary embodiment of the present invention is next described. The fabrication method of semiconductor device 100 according to the present exemplary embodiment differs from the fabrication method of semiconductor device 100 according to the first exemplary embodiment with regard to the lamination step and the cylindrical hole formation step. In the following explanation, FIGS. 3A and 3B to FIGS. 5A and 5B that were used in the explanation of the first exemplary embodiment are here used to describe the process from the lamination step to the cylindrical hole formation step in the fabrication method of the semiconductor device according to the present exemplary embodiment, and explanation of other steps is here omitted.

The lamination step according to the present exemplary embodiment is first described using FIGS. 3A and 3B. In the lamination step according to the present exemplary embodiment, first amorphous silicon film 301A having a thickness of 1 μm is formed by a thermal CVD method on the upper surface of semiconductor substrate 303. In this thermal CVD method, monosilane ($SiH_4$) and nitrogen ($N_2$) are used as the raw-material gas, the gas flow rate of $SiH_4$ is 2 SLM, the gas flow rate of $N_2$ is 5 sccm, the film-formation temperature is 530° C., and the pressure is 90 Pa.

Second amorphous silicon film 301B having a thickness of 1 μm is next formed by a thermal CVD method on the upper surface of first amorphous silicon film 301A. In this thermal CVD method, monosilane ($SiH_4$) and nitrogen ($N_2$) are used as the raw-material gas, the gas flow rate of $SiH_4$ is 2 SLM, the gas flow rate of $N_2$ is 5 sccm, the film-formation temperature is 500° C., and the pressure is 90 Pa.

Next, the removal of amorphous silicon film 301 in peripheral circuit region 100B, the formation of peripheral insulating film 120, the formation of mask insulating film 112, and the formation of opening 302 in mask insulating film 112 are carried out as in the first exemplary embodiment.

Through-holes 401 are next formed by a dry-etching method using mask insulating film 112 as a mask as shown in FIGS. 4A and 4B.

The cylindrical hole formation step is next carried out for forming cylindrical holes 113 as shown in FIGS. 5A and 5B. In the cylindrical hole formation step according to the present exemplary embodiment, wet etching is carried out for two minutes using APM that is formulated in the ratio of $NH_4OH:H_2O_2:H_2O=2:1:200$. The implementation of wet etching enlarges the diameters of first silicon film openings 401-1 in first amorphous silicon film 301A and second silicon film openings 401-2 in second amorphous silicon film 301B and forms cylindrical holes 113.

The difference in the amount of enlargement of the diameters of first silicon film openings 401-1 and second silicon film openings 401-2 is here explained using FIG. 14.

In the present exemplary embodiment, first amorphous silicon film 301A is a type-F amorphous silicon film, and second amorphous silicon film 301B is a type-G amorphous silicon film. As a result, carrying out wet etching for two minutes enlarges the diameter of first silicon film openings 401-1 in first amorphous silicon film 301A by 9.2 nm and enlarges the diameter of second silicon film openings 401-2 in second amorphous silicon film 301B by 8.4 nm.

Before wet etching, the diameter of first silicon film openings 401-1 is smaller than that of second silicon film openings 401-2. However, the amount of enlargement of the diameter by wet etching is greater in first silicon film openings 401-1 than in second silicon film openings 401-2. Accordingly, the amount of enlargement of the diameter is greater in first silicon film openings 401-1 that have a smaller diameter, whereby the area of the inner surfaces of cylindrical holes 113 increases without an increase in the area occupied, resulting in an ideal shape.

Thus, according to the present exemplary embodiment, first amorphous silicon film 301A is formed by a thermal CVD method in which the film-formation temperature is 530° C. and second amorphous silicon film 301B is formed by a thermal CVD method in which the film-formation temperature is 500° C. in the lamination step. In addition, APM is used to carry out wet etching in the cylindrical hole formation step to form cylindrical holes.

As a result, a simplification of the fabrication steps can be achieved by forming a plurality of types of amorphous silicon film by the thermal CVD method in which the temperature differs according to changes in the film formation conditions.

Fifth Exemplary Embodiment

The fabrication method of semiconductor device 100 according to the fifth exemplary embodiment of the present invention is next described. The fabrication method of semiconductor device 100 according to the present exemplary embodiment differs from the fabrication method of semiconductor device 100 according to the first exemplary embodiment with regard to the lamination step and the cylindrical hole formation step. In the following explanation, FIGS. 3A and 3B to FIGS. 5A and 5B that were used in the explanation of the first exemplary embodiment are used to describe the steps from the lamination step to the cylindrical hole formation step in the fabrication method of a semiconductor device according to the present exemplary embodiment, and redundant explanation of the other steps is omitted.

The lamination step according to the present exemplary embodiment is first described using FIGS. 3A and 3B. In the lamination step according to the present exemplary embodiment, first amorphous silicon film 301A having a thickness of 1 μm is formed by means of a plasma CVD method on the upper surface of semiconductor substrate 303. In this plasma CVD method, monosilane ($SiH_4$), hydrogen ($H_2$), and argon (Ar) are used as the raw-material gas, the gas flow rate of $SiH_4$ is 750 sccm, the gas flow rate of $H_2$ is 9 SLM, the gas flow rate of Ar is 1.5 SLM, the film-formation temperature is 550° C., the pressure is 18 Torr (approximately 2.4 KPa), and the high-frequency power is 600 W.

Second amorphous silicon film 301B having a thickness of 1 μm is next formed by a plasma CVD method on the upper surface of first amorphous silicon film 301A. In this plasma CVD method, monosilane ($SiH_4$), hydrogen ($H_2$), and argon (Ar) are used as the raw-material gas, the gas flow rate of $SiH_4$ is 750 sccm, the gas flow rate of $H_2$ is 9 SLM, the gas flow rate of Ar is 1.5 SLM, the film-formation temperature is 540° C., the pressure is 18 Torr (approximately 2.4 KPa), and the high-frequency power is 600 W.

The removal of amorphous silicon film 301 in peripheral circuit region 100B, the formation of peripheral insulating film 120, the formation of mask insulating film 112 and the formation of openings 302 in mask insulating film 112 are next carried out as in the first exemplary embodiment.

Through-holes 401 are next formed by a dry-etching method using mask insulating film 112 as a mask as shown in FIGS. 4A and 4B.

The cylindrical hole formation step is next carried out for forming cylindrical holes 113 as shown in FIGS. 5A and 5B. In the cylindrical hole formation step according to the present exemplary embodiment, wet etching is carried out for 30 seconds using a 0.5% ammonia aqueous solution ($NH_3 + H_2O$). The implementation of wet etching enlarges the diameters of first silicon film openings 401-1 in first amorphous silicon film 301A and second silicon film openings 401-2 in second amorphous silicon film 301B, whereby cylindrical holes 113 are formed.

The difference in the amount of enlargement of the diameters of first silicon film openings 401-1 and second silicon film openings 401-2 is next described using FIG. 8.

In the present exemplary embodiment, first amorphous silicon film 301A is a type-A amorphous silicon film, and second amorphous silicon film 301B is a type-B amorphous silicon film. As a result, carrying out wet etching for 30 second enlarges the diameter of first silicon film openings 401-1 in first amorphous silicon film 301A by 10 nm and enlarges the diameter of second silicon film openings 401-2 in second amorphous silicon film 301B by 8 nm.

Before wet etching, the diameter of first silicon film openings 401-1 is smaller than the diameter of second silicon film openings 401-2. As a result, the amount of enlargement of the diameter resulting from wet etching is greater for first silicon film openings 401-1 that have a smaller diameter and smaller for second silicon film openings 401-2 that have a larger diameter. Accordingly, cylindrical holes 113 achieve an ideal shape in which the area of the inner surfaces is sufficiently large.

Thus, in the lamination step according to the present exemplary embodiment, first amorphous silicon film 301A is formed by a plasma CVD method in which the film-formation temperature is 550° C., and the second amorphous silicon film 301B is formed by a plasma CVD method in which the film-formation temperature is 540° C. In the cylindrical hole formation step, wet etching is carried out using APM and cylindrical holes are formed.

As a result, by forming a plurality of types of amorphous silicon films by a plasma CVD method in which the temperature differs according to the film formation conditions, a simplification of the fabrication steps can be achieved.

In the explanation of each of the above-described exemplary embodiments, examples were used in which two types of silicon films were combined, but the present invention is not limited to this form, and three or more types of silicon films may be combined. Increasing the number of types of silicon films enables more precise control of the shape of cylindrical holes 113. However, increasing the number of types of silicon films also increases the number of steps, raising the concern of an increase in the fabrication costs, and the number of types of silicon films used is therefore preferably kept to the minimum necessary.

According to these embodiments, a semiconductor device comprising:
a cylinder interlayer film that is arranged on a semiconductor substrate; and
a capacitor that is made up of a sidewall insulating film, a lower electrode film, a capacitive insulating film, and an upper electrode film that are formed on inner walls of a through-hole that passes through said cylinder interlayer film;
wherein:
said cylinder interlayer film is made up of a laminated body composed of at least two layers of polycrystalline silicon films including: a first polycrystalline silicon film that is arranged on said semiconductor substrate and a second polycrystalline silicon film that is arranged on the upper surface of said first polycrystalline silicon film.

A semiconductor device comprising:
a cylinder interlayer film that is arranged on a semiconductor substrate; and
a capacitor that is made up of a sidewall insulating film, a lower electrode film, a capacitive insulating film, and an upper electrode film that are formed on inner walls of a through-hole that passes through said cylinder interlayer film;

wherein:
  said cylinder interlayer film is made up of a laminated body composed of at least two layers of polycrystalline silicon films including: a first polycrystalline silicon film that is arranged on said semiconductor substrate and a second polycrystalline silicon film that is arranged on the upper surface of said first polycrystalline silicon film.

Moreover, the semiconductor device as set forth above, wherein said cylinder interlayer film is a conductor composed of a polycrystalline silicon film that contains an impurity.

Moreover, the semiconductor device as set forth above, wherein the concentration of impurities contained in said cylinder interlayer film is $1 \times 10^{20}$-$1 \times 10^{21}$ (atoms/cm$^3$).

Moreover, the semiconductor device as set forth above, wherein:
  cylinder interlayer film power-supply wiring is connected to said cylinder interlayer film by way of a first contact plug, and
  upper electrode power-supply wiring is connected to said upper electrode by way of a second contact plug.

Moreover, the semiconductor device as set forth above, wherein the first contact plug that is connected to said cylinder interlayer film and the second contact plug that is connected to said upper electrode are connected to the same power-supply wiring.

Moreover, the semiconductor device as set forth above, wherein said capacitor is made up of: an inner capacitor that is composed of said lower electrode film, said capacitive insulating film and said upper electrode; and an outer capacitor that is composed of said lower electrode, said sidewall insulating film and said cylinder interlayer film.

Moreover, the semiconductor device as set forth above, wherein stepped portions occur at the borders of each of the polycrystalline silicon films that make up said cylinder interlayer film on the inner walls of said through-hole.

Moreover, the semiconductor device as set forth above, further comprising:
  a mask insulating film on a portion of the upper surface of the uppermost layer of the polycrystalline silicon films that make up said cylinder interlayer film;
wherein:
  said through-hole passes through said mask insulating film; and
  a stepped portion occurs on the inner walls of said through-hole at the border of said mask insulating film and said uppermost layer polycrystalline silicon film.

Moreover, the semiconductor device as set forth above, further comprising:
  a stopper insulating film on the lower surface of the lowermost polycrystalline silicon film that makes up said cylinder interlayer film;
wherein:
  said through-hole passes through said stopper insulating film; and
  a stepped portion occurs on the inner walls of said through-hole at the border of said stopper insulating film and said lowermost polycrystalline silicon film.

Moreover, the semiconductor device as set forth above, wherein:
  said cylinder interlayer film is arranged in the capacitor formation region, and a peripheral insulating film is provided in the peripheral circuit region that encloses said capacitor formation region.

The invention of the present application has been described hereinabove with reference to exemplary embodiments, but the present invention is not limited to the above-described exemplary embodiments. The configuration and details of the invention of the present application are open to various modifications within the scope of the invention of the present application that will be clear to one of ordinary skill in the art.

This application claims the benefits of priority based on Japanese Patent Application No. 2013-192741 for which application was submitted on Sep. 18, 2013 and Japanese Patent Application No. 2014-086449 for which application was submitted on Apr. 18, 2014 and incorporates by citation all of the disclosures of these applications.

What is claimed is:

1. A semiconductor device fabrication method comprising:
  laminating a plurality of amorphous silicon films on a semiconductor substrate;
  forming a through-hole that passes through said plurality of amorphous silicon films; and
  subjecting said plurality of amorphous silicon films having said through-hole to an etching process that uses an alkaline aqueous solution;
wherein:
  said plurality of amorphous silicon films is formed including a first amorphous silicon film and a second amorphous silicon film in which the rate of etching using said alkaline aqueous solution is slower than that of said first amorphous silicon film; and
  said first amorphous silicon film is interposed between said semiconductor substrate and said second amorphous silicon film.

2. The semiconductor device fabrication method as set forth in claim 1, wherein at least one of said first and second amorphous silicon films is formed by a plasma CVD method.

3. The semiconductor device fabrication method as set forth in claim 1, wherein at least one of said first and second amorphous silicon films is formed by a thermal CVD method.

4. The semiconductor device fabrication method as set forth in claim 1, wherein said first and second amorphous silicon films are formed by a CVD method in which the temperature differs according to the film formation conditions; the temperature during the film formation of the first amorphous silicon film being higher than the temperature during film formation of the second amorphous silicon film.

5. The semiconductor device fabrication method as set forth in claim 1, wherein said alkaline aqueous solution is an aqueous solution that contains $NH_4^+$ (ammonium ions) and $OH^-$ (hydroxide ions).

6. The semiconductor device fabrication method as set forth in claim 5, wherein said alkaline aqueous solution is an aqueous solution that contains ammonia and an oxidant.

7. The semiconductor device fabrication method as set forth in claim 6, wherein said alkaline aqueous solution is an aqueous solution that contains ammonia and hydrogen peroxide.

8. The semiconductor device fabrication method as set forth in claim 1, further comprising:
  after the implementing the etching process by using said alkaline aqueous solution, heating said plurality of amorphous silicon films and reforming at least a portion of said plurality of amorphous silicon into polycrystalline silicon.

9. The semiconductor device fabrication method as set forth in claim 1, further comprising:
  after said laminating a plurality of amorphous silicon films on said semiconductor substrate, selectively removing said plurality of amorphous silicon films that were formed in a peripheral circuit region to expose the semiconductor substrate surface; and
  embedding a dielectric film in portions in which said amorphous silicon films were removed.

10. The semiconductor device fabrication method as set forth in claim 1, further comprising:

after the subjecting said plurality of amorphous silicon films having a through-hole to an etching process that uses an alkaline aqueous solution, forming a sidewall insulating film, a lower electrode film, a capacitive insulating film, and an upper electrode film in order inside said through-hole.

* * * * *